US010692772B2

(12) United States Patent
Cheng et al.

(10) Patent No.: US 10,692,772 B2
(45) Date of Patent: Jun. 23, 2020

(54) INTEGRATING METAL-INSULATOR-METAL CAPACITORS WITH FABRICATION OF VERTICAL FIELD EFFECT TRANSISTORS

(71) Applicant: International Business Machines Corporation, Armonk, NY (US)

(72) Inventors: Kangguo Cheng, Schenectady, NY (US); Xuefeng Liu, Schenectady, NY (US); Heng Wu, Altamont, NY (US); Peng Xu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/396,013

(22) Filed: Apr. 26, 2019

(65) Prior Publication Data

US 2019/0259666 A1 Aug. 22, 2019

Related U.S. Application Data

(63) Continuation of application No. 15/450,193, filed on Mar. 6, 2017, now Pat. No. 10,388,572.

(51) Int. Cl.
*H01L 21/8234* (2006.01)
*H01L 49/02* (2006.01)
(Continued)

(52) U.S. Cl.
CPC .... *H01L 21/823462* (2013.01); *H01L 21/822* (2013.01); *H01L 27/0629* (2013.01);
(Continued)

(58) Field of Classification Search
CPC ..... H01L 21/823475; H01L 21/823481; H01L 21/823418; H01L 29/42364;
(Continued)

(56) References Cited

U.S. PATENT DOCUMENTS 5,281,837 A 1/1994 Kohyama
6,635,167 B1 10/2003 Batman et al.
(Continued)

FOREIGN PATENT DOCUMENTS

KR 1020100080315 A 7/2010

OTHER PUBLICATIONS

English translation for Korean Application No. KR1020100080315A.
List of IBM Patents or Patent Applications Treated as Related.

*Primary Examiner* — Mouloucoulaye Inoussa
(74) *Attorney, Agent, or Firm* — Vazken Alexanian; Ryan, Mason & Lewis, LLP

(57) ABSTRACT

Device and methods are provided for fabricating semiconductor devices in which metal-insulator-metal (MIM) capacitor devices are integrally formed with vertical field effect transistor (FET) devices. For example, a semiconductor device includes first and second vertical FET devices, and a capacitor device, formed in different device regions of a substrate. A gate electrode of the first FET device and a first capacitor electrode of the capacitor device are patterned from a same first layer of conductive material. A gate electrode of the second FET device and a second capacitor electrode of the capacitor device are patterned from a same second layer of conductive material. A gate dielectric layer of the second FET device and a capacitor insulator layer of the capacitor device are formed from a same layer of dielectric material.

17 Claims, 21 Drawing Sheets

(51) Int. Cl.
  *H01L 27/06* (2006.01)
  *H01L 29/78* (2006.01)
  *H01L 29/66* (2006.01)
  *H01L 21/822* (2006.01)

(52) U.S. Cl.
  CPC ........ *H01L 28/88* (2013.01); *H01L 29/66666* (2013.01); *H01L 29/7827* (2013.01); *H01L 21/823487* (2013.01)

(58) Field of Classification Search
  CPC .............. H01L 27/0629; H01L 29/7827; H01L 29/517; H01L 29/51; H01L 28/88; H01L 27/10852; H01L 27/10894; H01L 28/91; H01L 23/5252; H01L 28/40; H01L 29/66833; H01L 29/7926; H01L 27/11582; H01L 23/5226; H01L 23/528; H01L 29/7889; H01L 27/11524; H01L 29/42332; H01L 29/66825; H01L 29/42344; H01L 27/11
  USPC ........... 438/381; 257/532, E21.008, E29.342
  See application file for complete search history.

(56) References Cited

U.S. PATENT DOCUMENTS

| | | | |
|---|---|---|---|
| 6,911,848 | B2 | 6/2005 | Vinciarelli |
| 8,552,491 | B2* | 10/2013 | Son .................... H01L 21/82343 257/328 |
| 8,633,119 | B2 | 1/2014 | Sato et al. |
| 8,816,420 | B1 | 8/2014 | Basker et al. |
| 8,981,463 | B2 | 3/2015 | Sandhu |
| 9,312,307 | B2 | 4/2016 | Bateman |
| 9,391,119 | B2 | 7/2016 | Chen |
| 9,564,428 | B1* | 2/2017 | Basker ................ H01L 27/0733 |
| 2003/0013241 | A1 | 1/2003 | Rockwell et al. |
| 2004/0166626 | A1 | 6/2004 | Clevenger et al. |
| 2011/0039381 | A1 | 2/2011 | Son et al. |
| 2012/0161746 | A1 | 6/2012 | Holsen et al. |
| 2013/0093050 | A1* | 4/2013 | Busch ............... H01L 27/10852 257/532 |

* cited by examiner

FIG. 1A
100

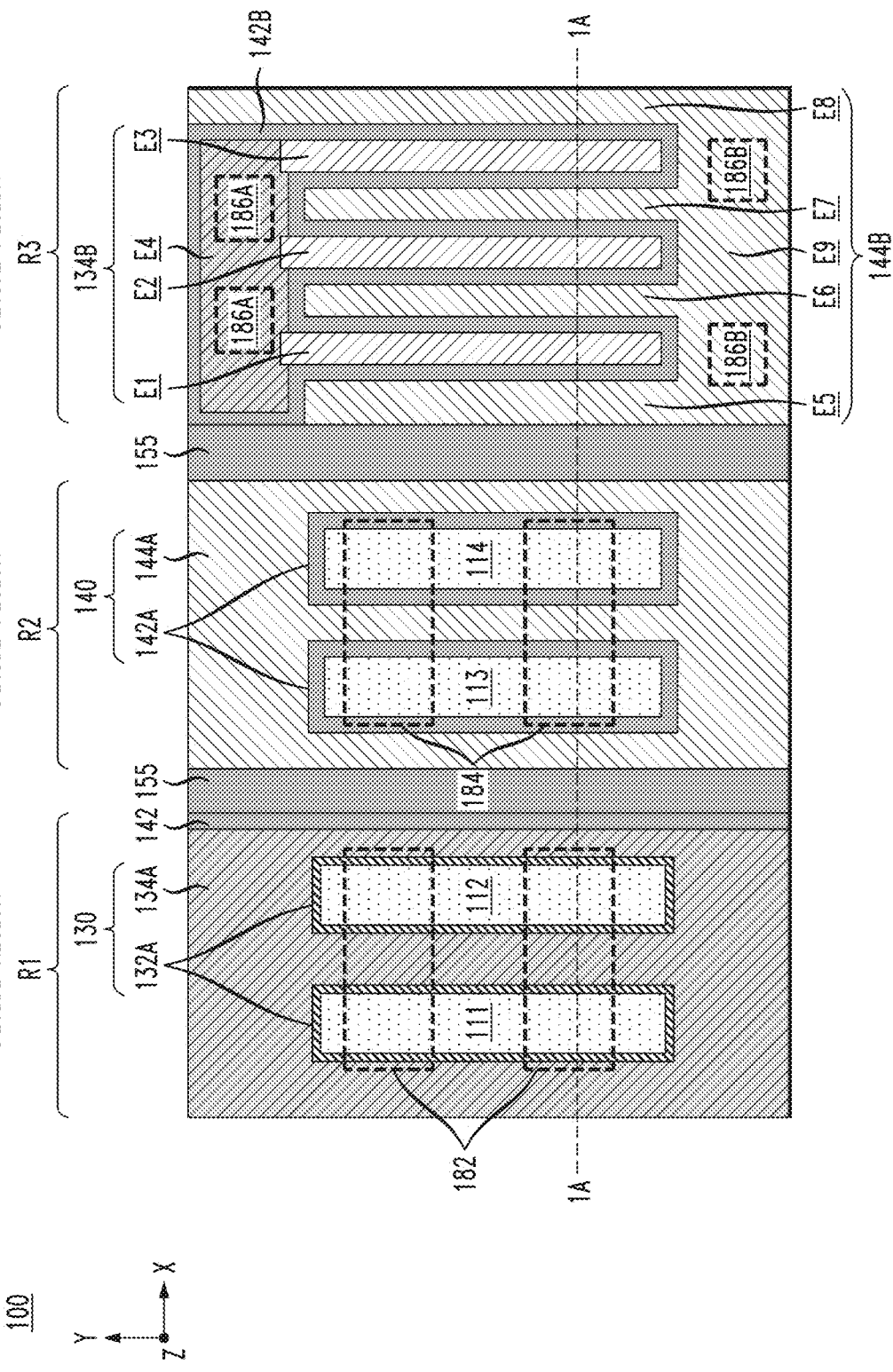

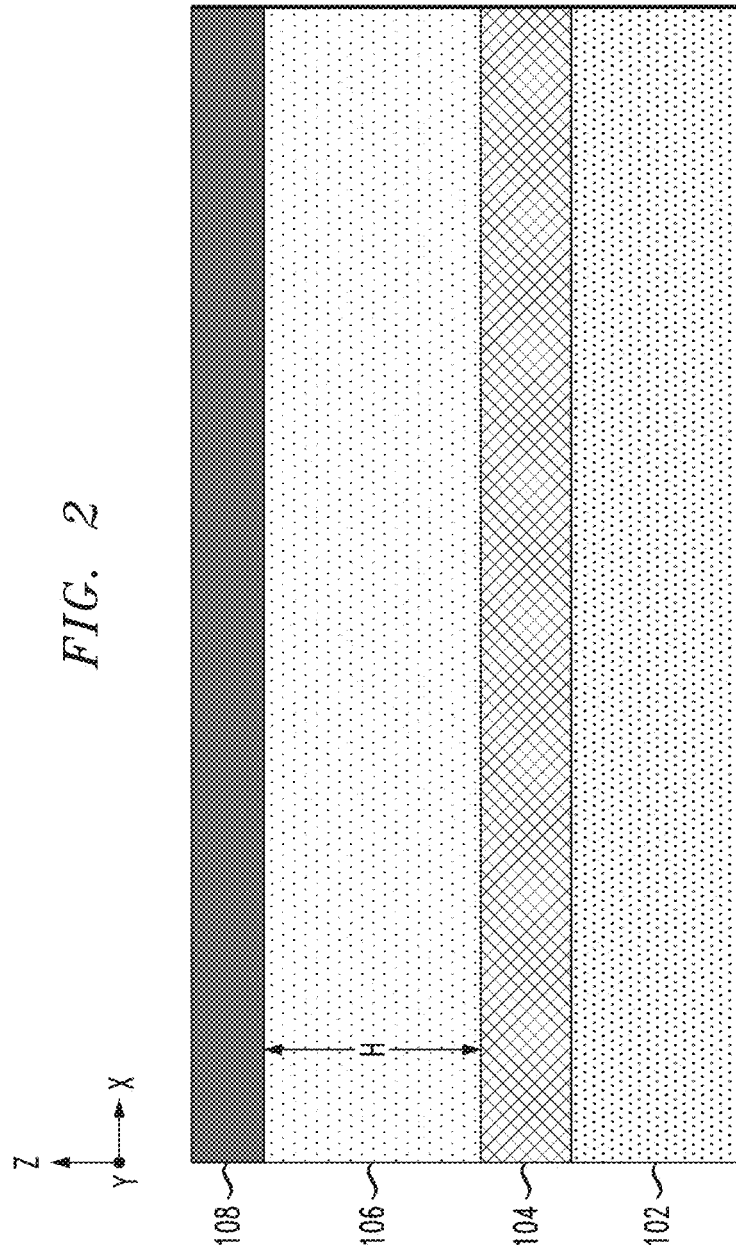

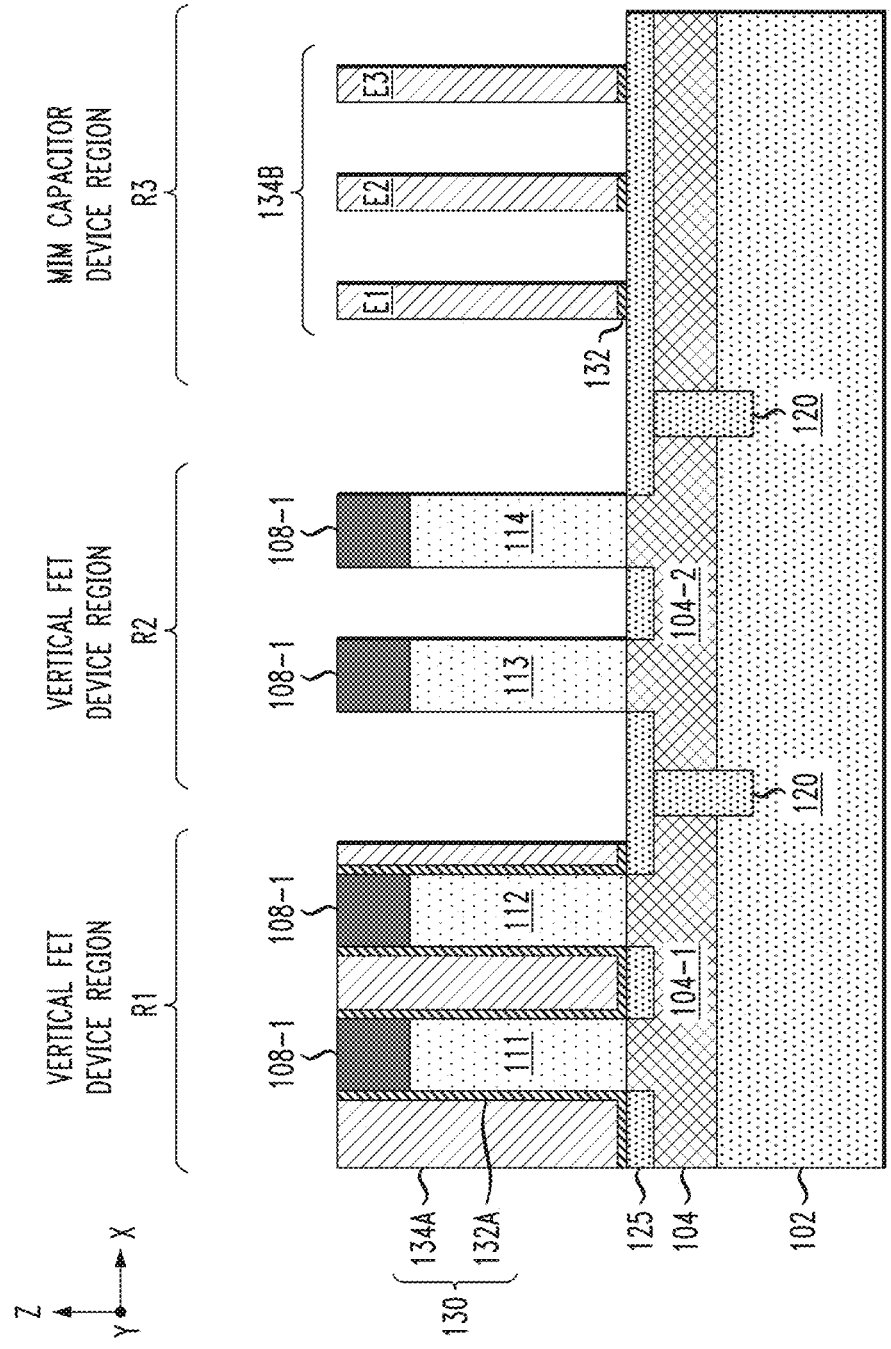

INTEGRATING METAL-INSULATOR-METAL CAPACITORS WITH FABRICATION OF VERTICAL FIELD EFFECT TRANSISTORS

TECHNICAL FIELD

This disclosure relates generally to semiconductor fabrication techniques and, in particular, techniques for fabricating MIM (metal-insulator-metal) capacitors.

BACKGROUND

Capacitors are passive circuit components that are utilized in integrated circuitry of a semiconductor chip for various purposes. For example, capacitors can be utilized to decouple power supplies, to form memory elements, to form RC delay circuits, or provide various other circuit functions. While many types of capacitor structures can be utilized, MIM capacitors are commonly used for analog, microwave, and radio frequency (RF) applications. In general, planar MIM capacitors are comprised of two metallic plates separated by an insulator layer. The fabrication of planar MIM capacitors using conventional CMOS technologies requires multiple lithographic masking steps, which is time consuming and expensive. In this regard, the amount and complexity of additional processing steps that are incorporated as part of a semiconductor process flow to fabricate MIM capacitors should be minimized to reduce the fabrication costs and processing time for constructing semiconductor chips. In addition, since planar MIM capacitors typically occupy a relatively large footprint of die area, there is a need for small footprint, high capacitance MIM capacitor structures for highly-integrated advanced semiconductor chip applications.

SUMMARY

Embodiments of the invention include semiconductor devices comprising MIM capacitor devices that are integrated with vertical field effect transistor (FET) devices, as well as methods for integrating MIM capacitor formation as part of a semiconductor process flow for fabricating vertical FET devices.

For example, one embodiment includes a semiconductor device which comprises a first vertical FET device formed in a first device region of a substrate, a second vertical FET device formed in a second device region of the substrate, and a capacitor device formed in a third device region of the substrate. The first vertical FET device comprises a first vertical semiconductor fin, and a first gate structure disposed around sidewalls of the first vertical semiconductor fin, wherein the first gate structure comprises a first gate dielectric layer and a first gate electrode. The second vertical FET device comprises a second vertical semiconductor fin, and a second gate structure disposed around sidewalls of the second vertical semiconductor fin, wherein the second gate structure comprises a second gate dielectric layer and a second gate electrode. The capacitor device comprises a first capacitor electrode, a second capacitor electrode, and a capacitor insulator layer disposed between the first and second capacitor electrodes. The first gate electrode of the first FET device and the first capacitor electrode of the capacitor device are formed from a same first layer of conductive material. The second gate electrode of the second FET device and the second capacitor electrode of the capacitor device are formed from a same second layer of conductive material. The second gate dielectric layer of the second FET device and the capacitor insulator layer of the capacitor device are formed from a same layer of dielectric material.

Another embodiment includes a method for fabricating a semiconductor device. The method comprises:

forming a substrate comprising a lower source/drain layer disposed between a base semiconductor substrate and a layer of semiconductor material;

patterning the layer of semiconductor material to form at least a first vertical semiconductor fin and a second vertical semiconductor fin;

forming trench isolation regions through portions of the lower source/drain layer and into the semiconductor substrate to define a plurality of device regions comprising a first device region, a second device region, and a third device region, wherein the first device region comprises the first vertical semiconductor fin and a first lower source/drain region, and wherein the second device region comprises the second vertical semiconductor fin and a second lower source/drain region;

concurrently forming (i) a first gate structure surrounding sidewalls of the first vertical semiconductor fin in the first device region, and (ii) a first capacitor electrode in the third device region, wherein the first gate structure comprises a first gate dielectric layer and a first gate electrode, wherein the first gate electrode and the first capacitor electrode are concurrently formed from a same first layer of conductive material by depositing and patterning said same first layer of conductive material; and concurrently forming (i) a second gate structure surrounding sidewalls of the second vertical semiconductor fin in the second device region, (ii) a capacitor insulator layer on the first capacitor electrode and (iii) a second capacitor electrode on the capacitor insulator layer in the third device region, wherein the second gate structure comprises a second gate dielectric layer and a second gate electrode; wherein the second gate dielectric layer and the capacitor insulator layer are concurrently formed from a same conformal layer of dielectric material by depositing and patterning said same conformal layer of dielectric material, and wherein the second gate electrode and the second capacitor electrode are concurrently formed from a same second layer of conductive material by depositing and patterning said same second layer of conductive material.

Other embodiments will be described in the following detailed description of embodiments, which is to be read in conjunction with the accompanying figures.

BRIEF DESCRIPTION OF THE DRAWINGS

FIGS. 1A and 1B are schematic views of a semiconductor device comprising MIM capacitor devices that are integrated with vertical FET devices, according to an embodiment of the invention.

FIGS. 2 through 18 schematically illustrate a method for fabricating the semiconductor device of FIGS. 1A and 1B, according to an embodiment of the invention, wherein:

FIG. 2 is a schematic cross-sectional side view of the semiconductor device at an intermediate stage of fabrication in which a lower source/drain layer, a monocrystalline semiconductor layer, and hardmask layer are formed on a semiconductor substrate;

FIG. 3 is a schematic cross-sectional side view of the semiconductor structure of FIG. 2 after patterning the hardmask layer to form an etch hardmask, and patterning the monocrystalline semiconductor layer using an image of the etch hardmask to form an array of vertical semiconductor fins;

FIG. 4 is a schematic cross-sectional side view of the semiconductor structure of FIG. 3 after forming trench isolation regions to define and isolate a plurality of device regions;

FIG. 5 is a schematic cross-sectional side view of the semiconductor structure of FIG. 4 after forming a lower insulating spacer;

FIG. 6 is a schematic cross-sectional side view of the semiconductor structure of FIG. 5 after depositing a first conformal layer of dielectric material over the surface of the semiconductor structure;

FIG. 7 is a schematic cross-sectional side view of the semiconductor structure of FIG. 6 after depositing a first layer of conductive material over the first conformal layer of dielectric material;

FIG. 8 is a schematic cross-sectional side view of the semiconductor structure of FIG. 7 after planarizing the surface of the semiconductor structure down to the etch hardmask and forming a first cut mask over the planarized surface of the semiconductor structure;

FIGS. 9A and 9B are schematic views of the semiconductor structure of FIG. 8 after patterning the first layer of conductive material and the first conformal layer of dielectric material using the first cut mask to form a gate structure in the first device region and a first capacitor electrode in the third device region;

FIG. 10 is a schematic cross-sectional side view of the semiconductor structure of FIG. 9A after depositing a second conformal layer of dielectric material over the surface of the semiconductor structure;

FIG. 11 is a schematic cross-sectional view of the semiconductor structure of FIG. 10 after depositing a second layer of conductive material over the second conformal layer of dielectric material;

FIG. 12 is a schematic cross-sectional side view of the semiconductor structure of FIG. 11 after planarizing the surface of the semiconductor structure down to the etch hardmask to remove overburden portions of the second layer of conductive material and the second conformal layer of dielectric material, and forming a second cut mask over the planarized surface of the semiconductor structure;

FIG. 13 is a schematic cross-sectional side view of the semiconductor structure of FIG. 12 after patterning the second layer of conductive material using an image of the second cut mask to form trenches in the second layer of conductive material which define a gate electrode in a second device region and a second capacitor electrode in the third device region;

FIG. 15 is a schematic cross-sectional side view of the semiconductor structure of FIG. 14A after recessing upper surfaces of the gate structures, the capacitor device, and the insulating regions to a target level that defines a gate length $L_g$ of vertical FET devices in the first and second device regions;

FIG. 16 is a schematic cross-sectional side view of the semiconductor structure of FIG. 15 after forming an upper insulating spacer on recessed surfaces of the gate electrodes, the insulating regions, and the capacitor device, and forming a first interlevel dielectric (ILD) layer on the upper insulating spacer;

FIG. 17 is a schematic cross-sectional side view of the semiconductor structure of FIG. 16 after removing the etch hardmask to expose upper surfaces of the vertical semiconductor fins in the first and second device regions; and FIG. 18 is a schematic cross-sectional side view of the semiconductor structure of FIG. 17 after epitaxially growing upper source/drain regions on the exposed upper portions of the vertical semiconductor fins in the first and second device regions.

DETAILED DESCRIPTION

Figure 3:
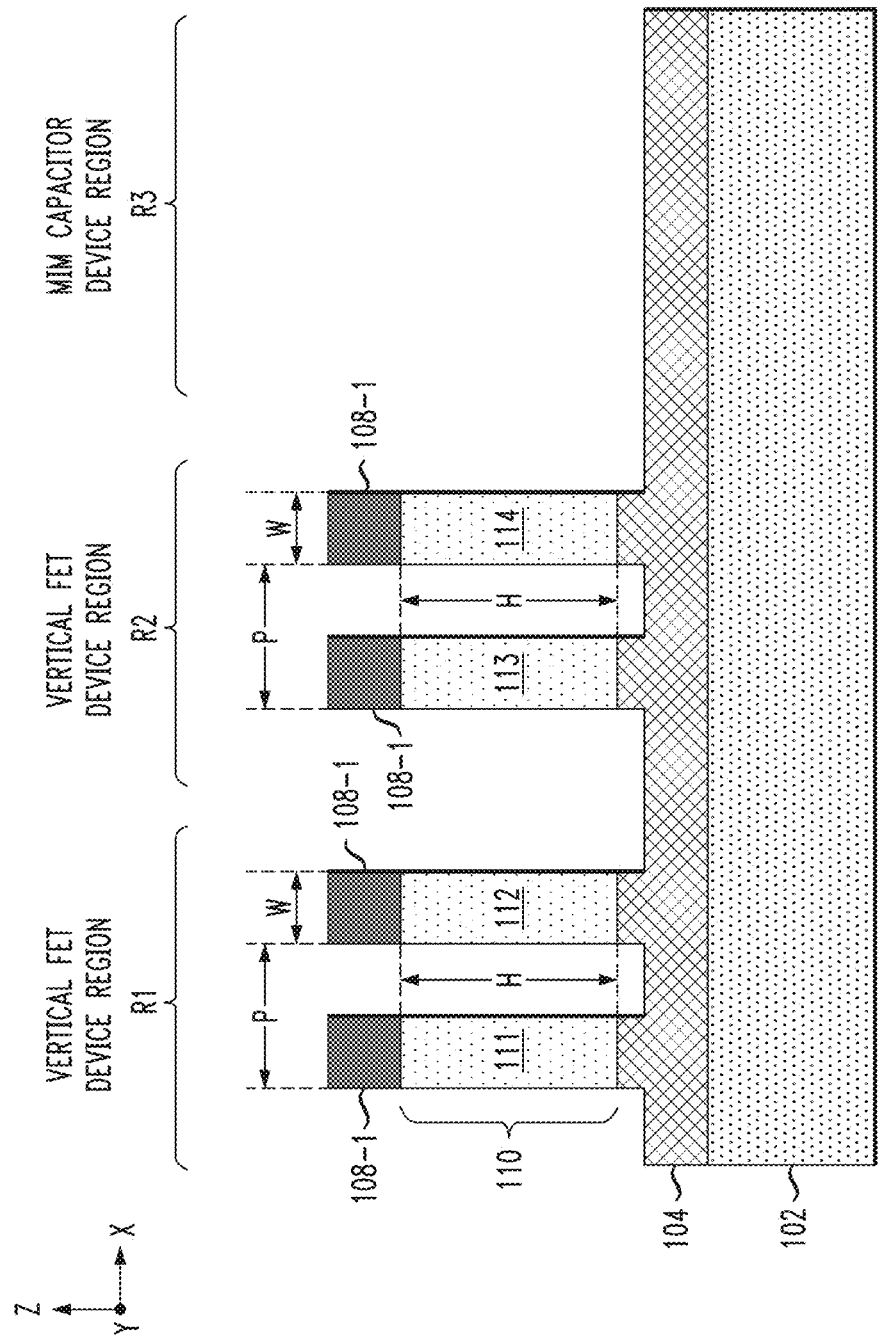

Embodiments of the invention will now be described in further detail with regard to semiconductor devices comprising MIM capacitor devices that are integrated with vertical FET devices, as well as methods for integrating MIM capacitor formation as part of a FEOL (front-end-of-line) process flow for fabricating vertical FET devices. As explained in further detail below, semiconductor fabrication techniques according to embodiments of the invention enable MIM capacitor devices to be readily fabricated within an FEOL layer using CMOS process modules of a FEOL process flow to construct vertical FET devices. The exemplary semiconductor process flows described herein allow integration of MIM capacitor devices with vertical FET devices for technology nodes of 7 nm and beyond.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount. Further, the term "vertical" or "vertical direction" as used herein denotes a Z-direction of the XYZ Cartesian coordinates shown in the drawings, and the terms "horizontal," or "horizontal direction," or "lateral direction" as used herein denotes an X-direction and/or Y-direction of the XYZ Cartesian coordinates shown in the drawings.

Figure 1A:
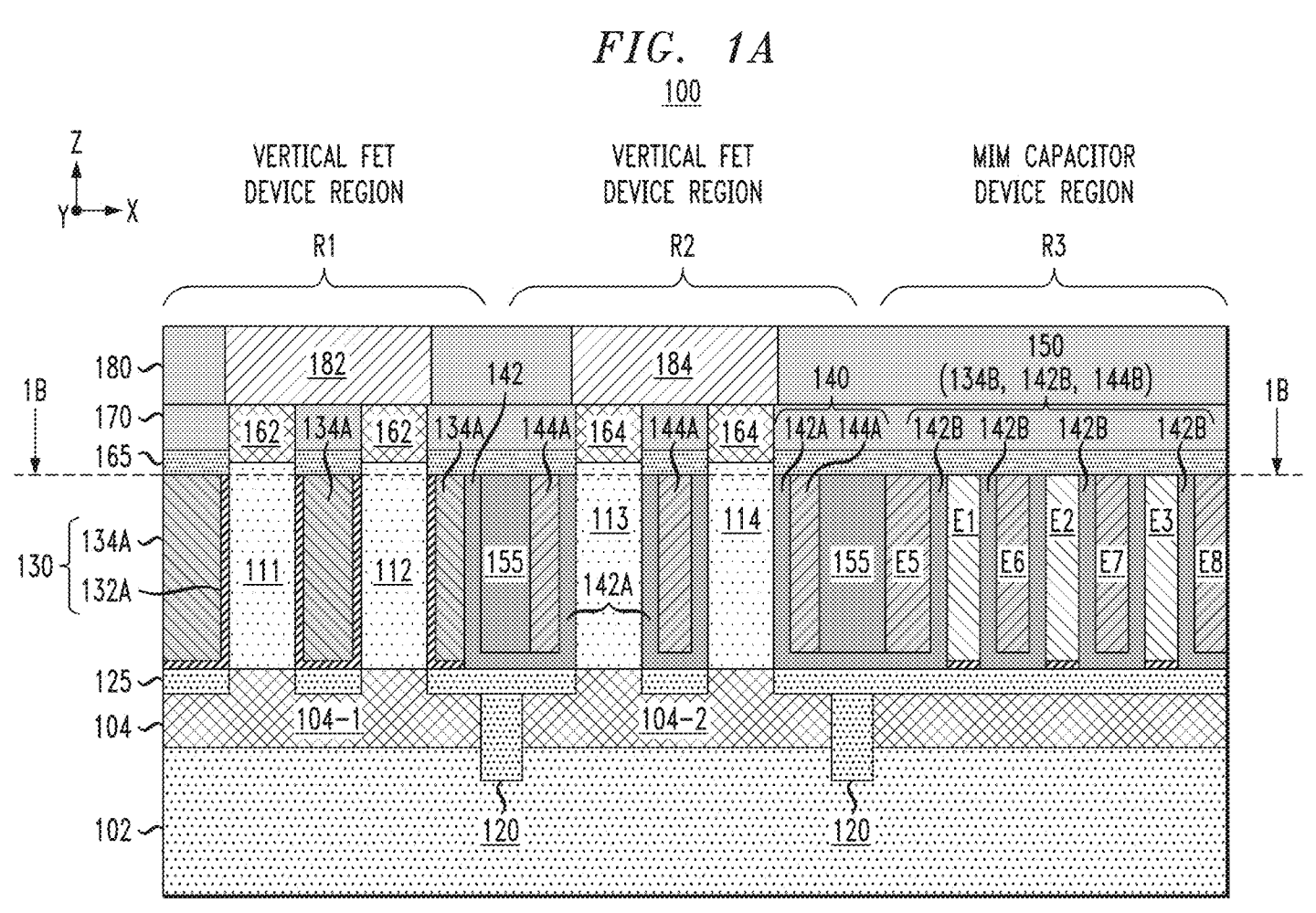

FIGS. 1A and 1B are schematic views of a semiconductor device 100 comprising MIM capacitor devices that are integrated with vertical FET devices, according to an embodiment of the invention. FIG. 1A is a schematic cross-sectional view (X-Z plane) of the semiconductor device 100 along line 1A-1A as shown in FIG. 1B, and FIG.

1B is a schematic top plan view of the semiconductor device 100 along an X-Y plane and direction as shown by line 1B-1B in FIG. 1A. Referring to FIG. 1A, the semiconductor device 100 comprises a base semiconductor substrate 102, a lower source/drain layer 104, trench isolation regions 120, a plurality of vertical semiconductor fins 111, 112, 113, and 114, a lower insulating spacer 125, a first gate structure 130, a second gate structure 140, a MIM capacitor device 150, insulating regions 155, upper source/drain regions 162 and 164, an upper insulating spacer 165, a first ILD layer 170, a second ILD layer 180, and source/drain contacts 182 and 185. It is to be understood that the term "source/drain region" as used herein means that a given source/drain region can be either a source region or a drain region, depending on the application or circuit configuration.

In the example embodiment shown in FIGS. 1A and 1B, the semiconductor device 100 comprises a plurality of different device regions including, for example, a first vertical FET device region R1 (or first device region), a second vertical FET device region R2 (or second device region), and a MIM capacitor device region R3 (or third device region). The device regions R1, R2, and R3 are defined by the trench isolation regions 120. The trench isolation regions 120 are formed through the lower source/drain layer 104 and into the semiconductor substrate 102 to define separate lower source/drain regions 104-1 and 104-2 for the vertical FET devices in the first and second device regions R1 and R2. As shown in FIG. 1A, the lower insulating spacer 125 serves to electrically insulate the lower source/drain regions 104-1 and 104-2 from the gate structures 130 and 140, respectively, as well as electrically insulate the MIM capacitor device 150 from the underlying portion of the lower source/drain layer 104 within the third device region R3. The upper insulating spacer 165 serves to electrically insulate the upper source/drain regions 162 and 164 from the gate structures 130 and 140, respectively. The insulating regions 155 serve to electrically insulate the gate structures 140 and 150 and the MIM capacitor device 150 from surrounding structures.

The first device region R1 comprises at least one vertical FET device which comprises the vertical semiconductor fins 111 and 112, the lower source/drain region 104-1, the upper source/drain regions 162, and the gate structure 130. The gate structure 130 comprises a conformal gate dielectric layer 132A and a gate electrode 134A. As collectively shown in FIGS. 1A and 1B, the conformal gate dielectric layer 132A is formed on the sidewalls of the vertical semiconductor fins 111 and 112, and the gate electrode 134A comprises conductive material (e.g., metal) that is disposed around the sidewalls of the vertical semiconductor fins 111 and 112. The vertical semiconductor fins 111 and 112 are commonly connected at one end to the lower source/drain region 104-1 with the separate upper source/drain regions 162 epitaxially grown on opposing ends of vertical semiconductor fins 111 and 112. The vertical source/drain contacts 182 (outlines shown in phantom in FIG. 1B as dashed lines) are commonly connected to each of the upper source/drain regions 162. In this configuration, the vertical semiconductor fins 111 and 112 comprise two FET channel segments that are connected in parallel, with a common gate structure 130, to collectively form a single, multi-fin vertical FET device in the first device region R1.

Similarly, second device region R2 comprises at least one vertical FET device which comprises the vertical semiconductor fins 113 and 114, the lower source/drain region 104-2, the upper source/drain regions 164, and the gate structure 140. The gate structure 140 comprises a conformal gate dielectric layer 142A and a gate electrode 144A. As collectively shown in FIGS. 1A and 1B, the conformal gate dielectric layer 142A is formed on the sidewalls of the vertical semiconductor fins 113 and 114, and the gate electrode 144A comprises conductive material (e.g., metal) that is disposed around the sidewalls of the vertical semiconductor fins 113 and 114. The vertical semiconductor fins 113 and 114 are commonly connected at one end to the lower source/drain region 104-2 with the separate upper source/drain regions 164 epitaxially grown on opposing ends of vertical semiconductor fins 113 and 114. The vertical source/drain contacts 184 (outlines shown in phantom in FIG. 1B as dashed lines) are commonly connected to each of the upper source/drain regions 164. In this configuration, the vertical semiconductor fins 113 and 114 comprise two FET channel segments that are connected in parallel, with a common gate structure 140, to collectively form a single, multi-fin vertical FET device in the second device region R2.

In the third device region R3, the MIM capacitor device 150 comprises a first capacitor electrode 134B, a second capacitor electrode 144B, and a capacitor insulator layer 142B disposed between the first and second capacitor electrodes 134B and 144B. As collectively shown in FIGS. 1A and 1B, the first capacitor electrode 134B comprises a plurality of parallel vertical fins E1, E2, and E3, which are commonly connected at one end to an elongated vertical fin segment E4. Similarly, the second capacitor electrode 144B comprises a plurality of parallel vertical fins E5, E6, E7, and E8, which are commonly connected at one end to an elongated vertical fin segment E9. In the example embodiment shown in FIGS. 1A and 1B, the first and second capacitor electrodes 134B and 144B comprise interdigitated comb-like electrode structures wherein the parallel vertical fins E1, E2, E3, E5, E6, E7, and E8 are disposed in an overlapped, interdigitated configuration.

As is known in the art, the capacitance of the MIM capacitor device 150 is (i) directly proportional to the surface area (A) of the overlapping parallel vertical fins E1, E2, E3, E5, E6, E7, and E8 of the first and second capacitor electrodes 134B and 144B, (ii) directly proportional to the dielectric constant of the dielectric material of the capacitor insulator layer 142B, and (iii) inversely proportional to the thickness of the capacitor insulator layer 142B. In this regard, a relatively large capacitance can be achieved in a relatively small capacitor footprint region (X-Y area) by implementing a MIM capacitor device structure (such as shown in FIGS. 1A and 1B) with an interdigitated vertical fin configuration.

As further shown in FIG. 1B, a plurality of vertical device contacts 186A (outlines shown in phantom in FIG. 1B as dashed lines) are formed through the insulating layers 165, 170 and 180 (FIG. 1A) in alignment with, and in contact to, the segment E4 of the first capacitor electrode 134B. In addition, a plurality of vertical device contacts 186B (outlines shown in phantom in FIG. 1B as dashed lines) are formed through the insulating layers 165, 170 and 180 (FIG. 1A) in alignment with, and in contact to, the segment E9 of the second capacitor electrode 144B. It is to be understood that the shapes and layout configurations of the various vertical contacts 182, 184, 186A, and 186B shown in FIG. 1B are merely illustrative embodiments, and that other shapes and layout configurations of vertical contacts can be implemented. In addition, while not specifically shown in FIGS. 1A and 1B, vertical gate contacts would be formed through the insulating layers 165, 170 and 180 in contact with the gate electrodes 134A and 144A of the respective gate structures 140 and 150, and vertical source/drain contacts would be formed through the various layers in contact with the lower source/drain regions 104-1 and 104-2 in the vertical FET device regions R1 and R2.

As noted above, semiconductor fabrication techniques according to embodiments of the invention implement an integrated process flow that enables the MIM capacitor device 150 in the third device region R3 to be fabricated are part of the FEOL process modules that are used to construct the vertical FET devices in the first and second device regions R1 and R2. In one example embodiment of the invention, the vertical FET devices formed in the first device region R1 comprise high performance, low power, vertical FET devices that are fabricated with thin, high-k gate dielectric layers, while the vertical FET devices formed in the second device region R2 comprise high power (high current) vertical FET devices with relatively thicker gate dielectric layers (e.g., silicon oxide) that can withstand time-dependent dielectric breakdown (TDDB) and other gate failure mechanisms that may result from high power applications. For example, the vertical FET device in the first device region R1 may be a standard logic transistor which requires better gate control and low current flow, while the vertical FET device in the second device region may be an input/output (I/O) transistor which requires a larger current flow.

In one embodiment, a FEOL process flow is implemented in which the gate electrode 134A of the gate structure 130 of the vertical FET device in the first device region R1 and the first capacitor electrode 134B of the MIM capacitor device 150 in the third device region R3 are concurrently formed from a same layer of conductive material 134 (e.g., FIG. 7) using a FEOL process module (e.g., FIGS. 7, 8, 9A, and 9B) that comprises depositing and patterning the same layer of conductive material 134 to form the gate electrode 134A and the first capacitor electrode 134B. In addition, the FEOL process flow comprises a process module (e.g., FIGS. 10, 11, and 12) in which the gate dielectric gate layer 142A of the gate structure 140 of the vertical FET device in the second device region R2 and the capacitor insulator layer 142B of the MIM capacitor device 150 in the third device region R3 are concurrently formed from a same layer of dielectric material 142 (e.g., FIG. 10) by depositing and patterning the same layer of dielectric material 142. Moreover, the FEOL process flow comprises a process module in which the gate electrode 144A of the gate structure 140 of the vertical FET device in the second device region R2 and the second capacitor electrode 144B of the MIM capacitor device 150 in the third device region R3 are concurrently formed from a same layer of conductive material 144 (e.g., FIG. 11) using a FEOL process module (e.g., FIGS. 11, 12 and 13) that comprises depositing and patterning the same layer of conductive material 144 to form the gate electrode 144A and the second capacitor electrode 144B.

Methods for fabricating the semiconductor device 100 shown in FIGS. 1A and 1B will now be discussed in further detail with reference to FIG. 2 through FIG. 18, which schematically illustrate the semiconductor device 100 at various stages of fabrication. To begin, FIG. 2 is a schematic cross-sectional side view of the semiconductor device at an intermediate stage of fabrication in which a lower source/drain layer 104, a monocrystalline semiconductor layer 106, and a hardmask layer 108 are formed on a semiconductor substrate 102. The monocrystalline semiconductor layer 106 has a vertical height H (or thickness) which defines a height of vertical semiconductor fins that are subsequently formed by patterning the monocrystalline semiconductor layer 106.

The hardmask layer 108 comprise an insulating material, such as silicon nitride, which is patterned to form an etch hardmask that is used to pattern the monocrystalline semiconductor layer 106 in a subsequent process module. While the semiconductor substrate 102 is generically illustrated in FIG. 2, the semiconductor substrate 102 may comprise one of different types of semiconductor substrate structures.

For example, in one embodiment, the semiconductor substrate 102 may comprise a bulk semiconductor substrate formed of, e.g., silicon, or other types of semiconductor substrate materials that are commonly used in bulk semiconductor fabrication processes such as germanium, silicon-germanium alloy, silicon carbide, silicon-germanium carbide alloy, or compound semiconductor materials (e.g. III-V and II-VI). Non-limiting examples of compound semiconductor materials include gallium arsenide, indium arsenide, and indium phosphide. In another embodiment, the semiconductor substrate 102 may comprise an active semiconductor layer (e.g., silicon layer, SiGe layer, III-V compound semiconductor layer, etc.) of a SOI (silicon on insulator) substrate, which comprises an insulating layer (e.g., oxide layer) disposed between a base substrate layer (e.g., silicon substrate) and the active semiconductor layer 102 in which active circuit components are formed as part of a FEOL layer.

The lower source/drain layer 104 and the monocrystalline semiconductor layer 106 are formed using known techniques and materials. For example, in one embodiment, the lower source/drain layer 104 comprises a doped epitaxial semiconductor layer that is epitaxially grown on a surface of the semiconductor substrate 102, and the monocrystalline semiconductor layer 106 comprises an epitaxial semiconductor layer that is epitaxially grown on a surface of the lower source/drain layer 104. In one embodiment, the monocrystalline semiconductor layer 106 is undoped. In another embodiment, the monocrystalline semiconductor layer 106 is lightly doped with doping concentration, for example, of less than $5 \times 10^{18}/cm^3$. As explained in further detail below, the lower source/drain layer 104 is subsequently patterned to form the lower source/drain regions 104-1 and 104-2 of the vertical FET devices in the respective device regions R1 and R2, and the undoped monocrystalline semiconductor layer 106 is subsequently patterned to form the vertical semiconductor fins 111, 112, 113 and 114 of the vertical FET devices, as shown in FIGS. 1A and 1B.

The type of epitaxial semiconductor material that is used to form the lower source/drain layer 104 will vary depending on various factors including, but not limited to, the type of semiconductor material used to grow the monocrystalline semiconductor layer 106 (lattice-matched semiconductor materials), the device type (e.g., n-type or p-type) of the vertical FET devices, etc. For example, for n-type vertical FET devices, the lower source/drain layer 104 may comprise a doped epitaxial silicon (Si) material, and for p-type vertical FET devices, the lower source/drain layer 104 may comprise a doped epitaxial silicon-germanium (SiGe) layer. Moreover, in one embodiment, the undoped monocrystalline semiconductor layer 106 may comprise an undoped single crystal Si layer. The lower source/drain layer 104 and the monocrystalline semiconductor layer 106 can be formed with other types of semiconductor materials (e.g., III-V compound semiconductor materials) which are commonly used to form source/drain regions and vertical semiconductor fins for vertical FET devices.

Furthermore, the lower source/drain layer 104 can be doped using known techniques. For example, in one embodiment, the lower source/drain layer 104 is in-situ doped wherein dopants are incorporated into the lower source/drain layer 104 during epitaxial growth of the lower source/drain layer 104 using a dopant gas such as, for example, a boron-containing gas such as $BH_3$ for pFETs or a phosphorus or arsenic containing gas such as $PH_3$ or $AsH_3$ for nFETs. In another embodiment, dopants can be incorporated in the lower source/drain layer 104 after the epitaxy process using doping techniques such as ion implantation.

In yet another embodiment, the lower source/drain layer 104 can be formed without epitaxy. For example, the lower source/drain layer 104 can be formed by adding dopants into a surface of the semiconductor substrate 102 (to a target depth which defines a thickness of the lower source/drain layer 104) using doping techniques such as ion implantation, gas phase doping, plasma doping, plasma immersion ion implantation, cluster doping, infusion doping, liquid phase doping, solid phase doping, etc. The monocrystalline semiconductor layer 106 is then epitaxially grown on the lower source/drain layer 104. The doping concentration in the lower source/drain layer 104 can be in a range from about $1 \times 10^{19}/cm^3$ to about $4 \times 10^{21}/cm^3$. In some embodiments, the lower source/drain layer 104 may comprise different materials in different device regions, e.g., a first material for n-type vertical FET devices, and another material for p-type vertical FET devices. Similarly, the monocrystalline semiconductor layer 106 may comprise different materials in different device regions, e.g., a first material for n-type vertical FET devices, and another material for p-type vertical FET devices.

In another embodiment of the invention, the lower source/drain layer 104 can be formed by ion implantation of dopants into the surface of the semiconductor substrate 102 to form a buried doped layer at a target level below the surface of the semiconductor substrate 102. For example, in this embodiment, the various layers 102, 104 and 106 may represent an upper surface of a undoped monocrystalline silicon substrate, wherein the lower source/drain layer 104 is formed by implanting dopants at one or more ion implantation energies which are sufficient to form the lower source/drain layer 104 within a range of target depths below the surface of the semiconductor substrate layer (wherein the range of target depths define the initial thickness (H) of the undoped monocrystalline layer 106). A thermal anneal process can be performed following the ion implantation process to recrystallize portions of the semiconductor substrate which may be partially damaged by the ion implantation, as is known in the art.

Next, FIG. 3 is a schematic cross-sectional side view of the semiconductor structure of FIG. 2 after patterning the hardmask layer 108 to form an etch hardmask 108-1, and patterning the monocrystalline semiconductor layer 106 using an image of the etch hardmask 108-1 to form an array of vertical semiconductor fins 110. In the example embodiment, the array of vertical semiconductor fins 110 comprises the vertical semiconductor fins 111 and 112 formed in the first device region R1 and the vertical semiconductor fins 113 and 114 formed in the second device region R2. The hardmask layer 108 may be patterned using known techniques including, but not limited to, standard photolithography techniques or sidewall image transfer (SIT) techniques, etc. A directional dry etch process (e.g., Reactive Ion Etch (RIE)) is then performed using the etch hardmask 108-1 to etch exposed portions of the monocrystalline semiconductor layer 106 down to the lower source/drain layer 104, and to slightly recess exposed surfaces of the lower source/drain layer 104.

As shown in FIG. 3, in one embodiment, the vertical semiconductor fins 111, 112, 113, and 114 in the first and second device regions R1 and R2 are patterned to have the same width (W) and pitch (P) throughout the regions R1 and R2, as well as the same length L in the Y-direction. In addition, the vertical semiconductor fins 111, 112, 113, and 114 are formed with a height H which, as noted above, is defined by the thickness of the monocrystalline semiconductor layer 106. In one example embodiment, the width W of the vertical semiconductor fins 111, 112, 113, and 114 is in a range of about 5 nm to about 20 nm, the length L of the vertical fins 111, 112, 113, and 114 is in a range of about 50 nm to about 1000 nm, and the pitch P of the vertical semiconductor fins 111 and 112 in the first device region R1, and the pitch P of the vertical semiconductor fins 113 and 114 in the second device region R2, is in a range of about 20 nm to about 100 nm. Further, the height H of the vertical semiconductor fins 111, 112, 113 and 114 is in a range of about 30 nm to about 100 nm.

Figure 4:
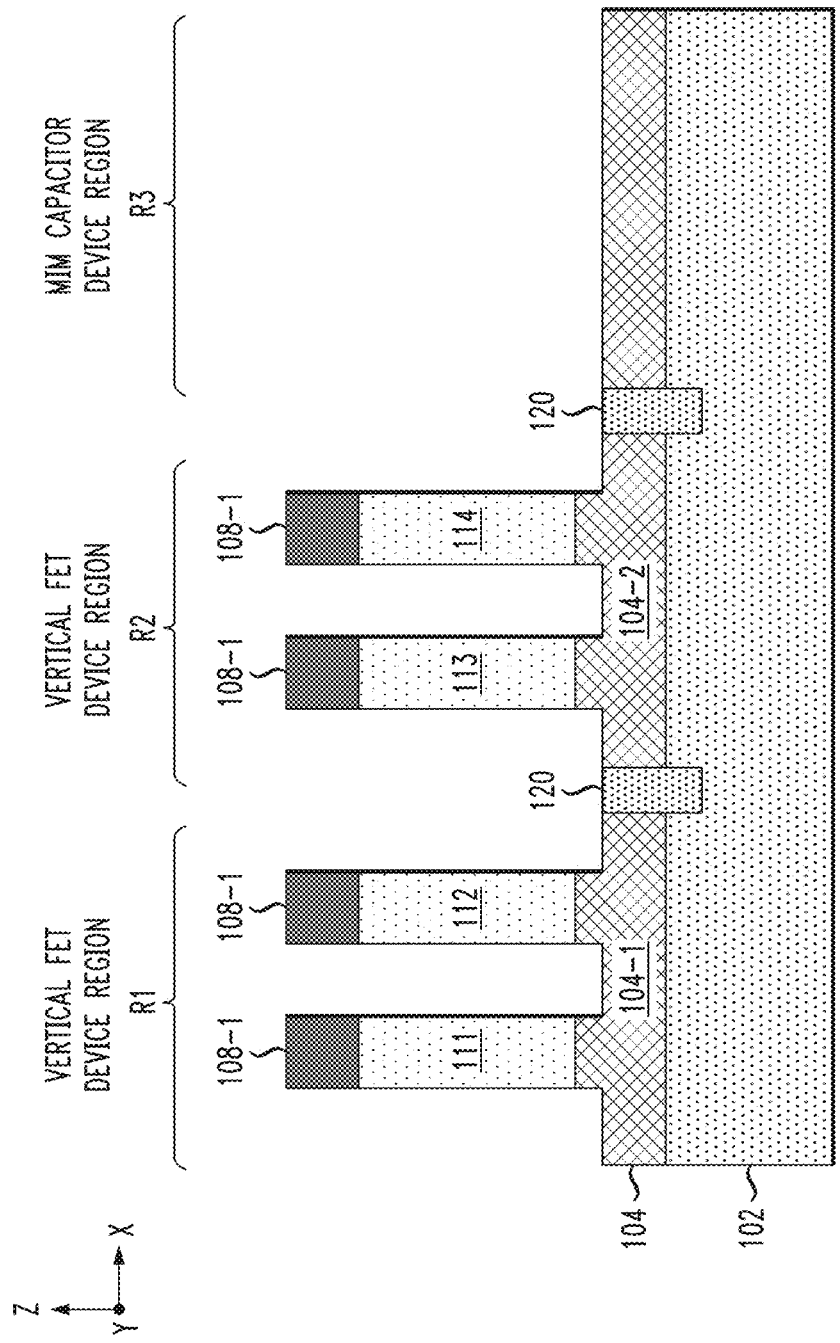

A next stage of the fabrication process comprises forming trench isolation regions (e.g., shallow trench isolation regions or deep trench isolation regions), as schematically illustrated in FIG. 4. In particular, FIG. 4 is a schematic cross-sectional side view of the semiconductor structure of FIG. 3 after forming the trench isolation regions 120 to define and isolate the different device regions R1, R2, and R3. In one embodiment of the invention, the trench isolation regions 120 are formed by a process which comprises forming an etch mask (e.g., photoresist mask) with openings that define images of trenches that are etched down through lower source/drain layer 104 into the semiconductor substrate layer 102, depositing a layer of insulating material, such as silicon oxide, to fill the trenches, and then recessing the layer of insulating material down to the recessed surface of the lower source/drain layer 104, to thereby form the trench isolation regions 120 shown in FIG. 4. In another embodiment, the trench isolation regions 120 are formed with multiple insulating materials, e.g., forming a silicon nitride liner to line the trenches, and filling remaining portions of the trenches with silicon oxide material. As shown in FIG. 4, the trench isolation regions 120 extend into the substrate 102 below the lower source/drain layer 104, thereby patterning the lower source/drain layer 104 to form the separate lower source/drain regions 104-1 and 104-2 of the vertical FET devices in the device regions R1 and R2, and to isolate a remaining portion of the lower source/drain layer 104 within the third device region R3.

Figure 5:
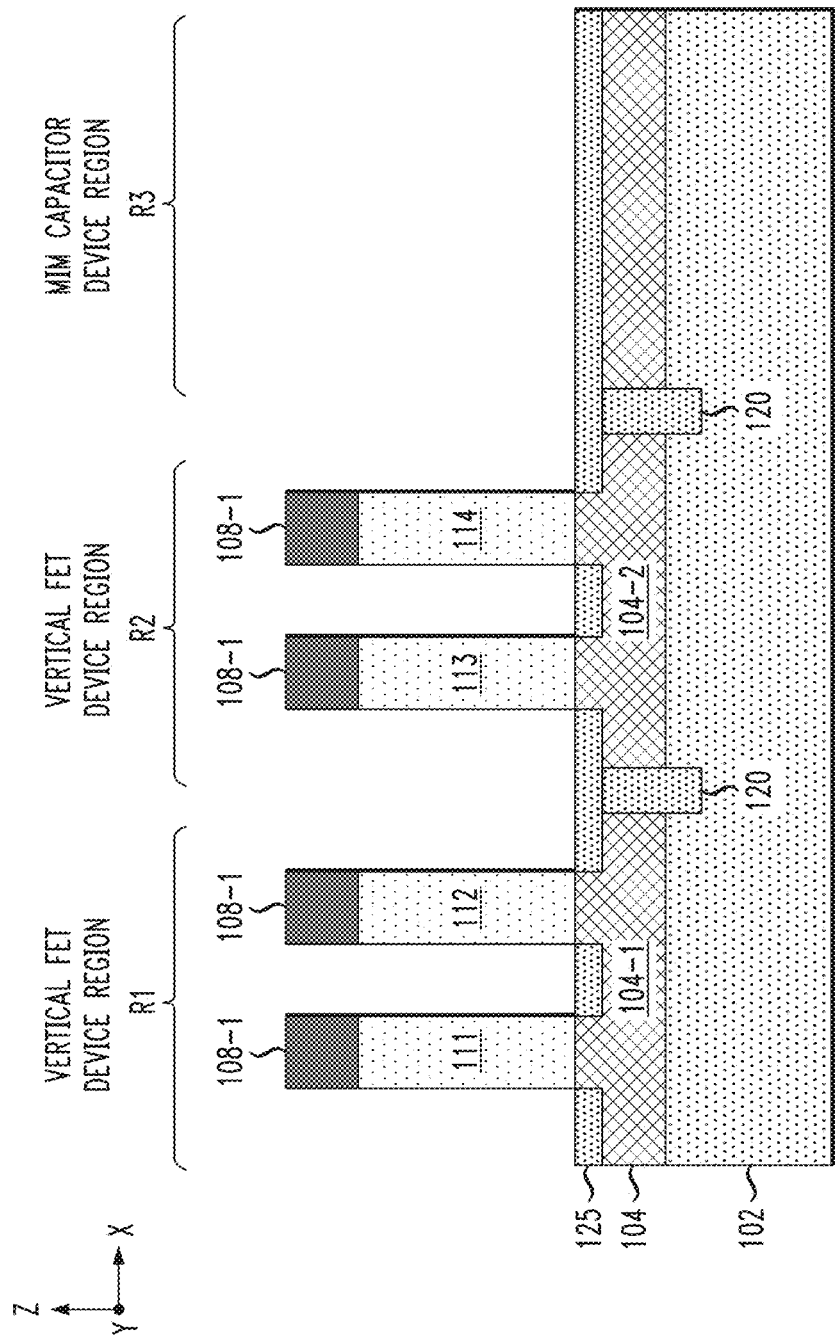

Next, FIG. 5 is a schematic cross-sectional side view of the semiconductor structure of FIG. 4 after forming the lower insulating spacer 125. In one embodiment, the lower insulating spacer 125 is formed by depositing a layer of dielectric material such as $SiO_2$, SiN, SiBCN or SiOCN, or some other type of low-k dielectric material that is commonly used to form insulating spacers for vertical FET devices. In one embodiment, the lower insulating spacer 125 has a thickness that is substantially equal to a vertical recess depth of the lower source/drain layer 104 such that an upper surface of the lower insulating spacer 125 is substantially level with bottom surfaces of the vertical semiconductor fins 111, 112, 113, and 114. The lower insulating spacer 125 may be formed using a directional deposition process in which the dielectric/insulating material is directly deposited on lateral surfaces, or by blanket depositing the dielectric/insulating material followed by planarizing and recessing the dielectric/insulating material, using well-known deposition and etching techniques.

In particular, in one embodiment, the lower insulating spacer 125 is formed of insulating material, such as silicon oxide, which is selectively deposited on lateral surfaces of the semiconductor structure using a directional deposition process (e.g., Gas Cluster Ion Beam (GCIB)). The directional deposition process serves to primarily deposit insulating material on the lateral surfaces of the semiconductor structure (e.g., on the recessed surface of the lower source/drain layer 104), while limiting or preventing deposition of insulating material on the vertical surfaces (e.g., sidewall surfaces of the vertical semiconductor fins 111, 112, 113, and 114). Any insulating material that is deposited on the upper lateral surfaces of the etch hardmask 108-1 are etched away in a subsequent planarizing process.

In another embodiment of the invention, the lower insulating spacer 125 can be formed as part of the process module for fabrication the trench isolation regions 120. In particular, after etching the trenches in the layers 104 and 102, a layer of insulating material (e.g., silicon oxide) is deposited and planarized down to the upper surfaces of the etch hardmask 108-1. Then, the planarized surface of the insulating material layer is recessed using a suitable etch process until the recessed surface of the insulating material layer reaches a target thickness above the lower source/drain layer 104, thereby concurrently forming the lower insulating spacer 125 and the trench isolation regions 120 using the same oxide material. With this process, a timed etch process is utilized to recess the layer of insulating material down to a target level which, for example, is substantially level with the bottom surfaces of the vertical semiconductor fins 111, 112, 113, and 114.

Figure 6:
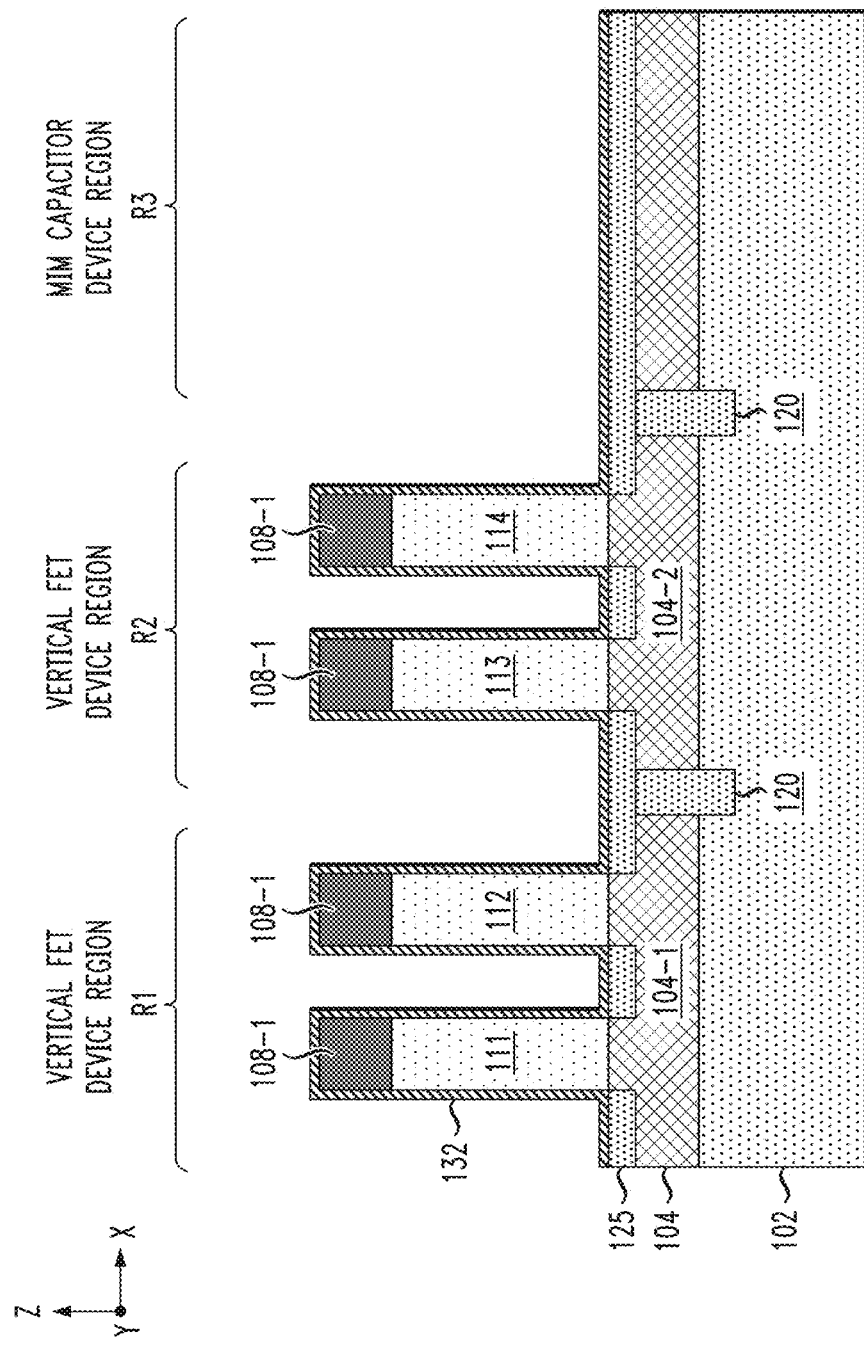

A next phase of the semiconductor fabrication process comprises an integrated process module for forming the gate structure 130 (e.g., metal gate structure) for the vertical FET device in the first device region R1 together with the first capacitor electrode 134B of the MIM capacitor 150 in the third device region R3, using a process flow as schematically illustrated in FIGS. 6-9B. In particular, FIG. 6 is a schematic cross-sectional side view of the semiconductor structure of FIG. 5 after depositing a first conformal layer of dielectric material 132 over the surface of the semiconductor structure. In one embodiment, the first conformal layer of dielectric material 132 is formed by depositing one or more conformal layers of high-k dielectric material having a dielectric constant k of about 3.9 or greater.

For example, the first conformal layer of dielectric material 132 can include silicon oxide, silicon nitride, silicon oxynitride, boron nitride, high-k materials, or any combination of these materials. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k gate dielectric material may further include dopants such as lanthanum, aluminum. In one embodiment of the invention, the first conformal layer of dielectric material 132 is formed with a thickness in a range of about 0.5 nm to about 5.0 nm (or more preferably, in a range of about 0.5 nm to about 2.5 nm), which will vary depending on the target application. The first conformal layer of dielectric material 132 is deposited using known methods such as atomic layer deposition (ALD), for example, which allows for high conformality of the gate dielectric material.

In another embodiment, a thin conformal layer of work function metal (WFM) may be deposited over the first conformal layer of dielectric material 132 prior to depositing a layer of conductive material to form a gate electrode. In this regard, in one embodiment, the conformal layer of dielectric material 132 shown in FIG. 6 would comprise a high-k gate stack structure comprising a thin conformal layer of dielectric material and a thin conformal WFM layer. The thin conformal WFM layer can be formed of one or more types of metallic materials, including, but not limited to, TiN, TaN, TiAlC, Zr, W, Hf, Ti, Al, Ru, Pa, TiAl, ZrAl, WAl, TaAl, HfAl, TiAlC, TaC, TiC, TaMgC, or other work function metals or alloys that are commonly used to obtain target work functions which are suitable for the type (e.g., n-type or p-type) of vertical FET devices that are to be formed. The conformal WFM layer is deposited using known methods such as ALD, chemical vapor deposition (CVD), etc. In one embodiment, the conformal WFM layer is formed with a thickness in a range of about 2 nm to about 5 nm.

Figure 7:
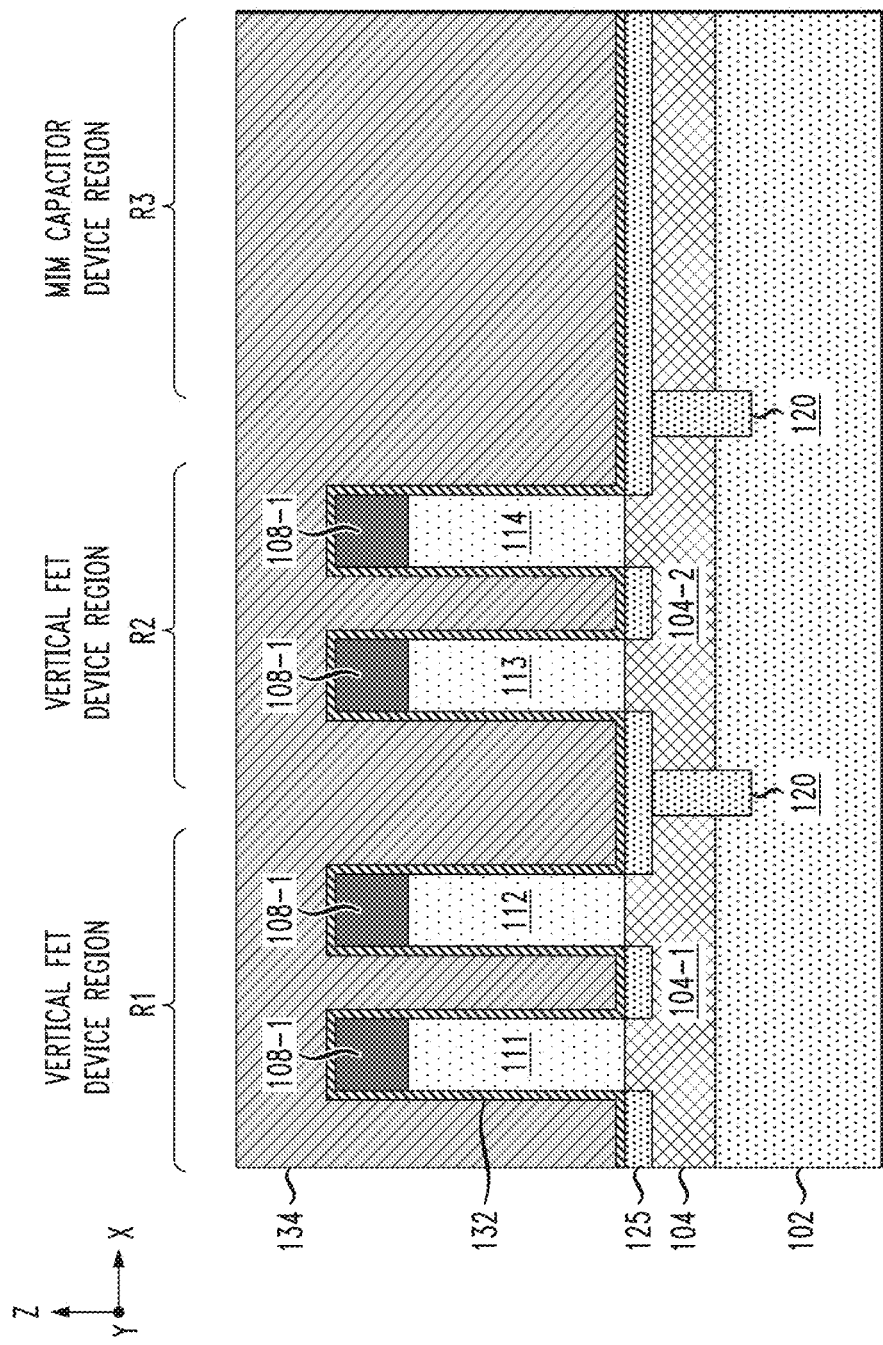

Next, FIG. 7 is a schematic cross-sectional side view of the semiconductor structure of FIG. 6 after depositing a first layer of conductive material 134 over the first conformal layer of dielectric material 132. In one embodiment, the first layer of conductive material 134 is formed by depositing a metallic material such as tungsten, or any other suitable metallic material such as titanium, tantalum, ruthenium, zirconium, cobalt, copper, aluminum, lead, platinum, tin, silver, gold, etc. In other embodiments, the first layer of conductive material 134 may be a conductive material including, but not limited to, a doped semiconductor material (e.g., polycrystalline or amorphous silicon, germanium, silicon germanium, etc.), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of such conductive materials. The first layer of conductive material 134 may further comprise dopants that are incorporated during or after deposition. The first layer of conductive material 134 is deposited using a suitable deposition process, for example, CVD, plasma-enhanced CVD (PECVD), physical vapor deposition (PVD), plating, thermal or e-beam evaporation, sputtering, etc. In another embodiment, the first layer of conductive material 134 can serve as a WFM layer, in which case a separate conformal WFM layer is not deposited over the first conformal layer of dielectric material 132 prior to depositing the first layer of conductive material 134.

Figure 8:
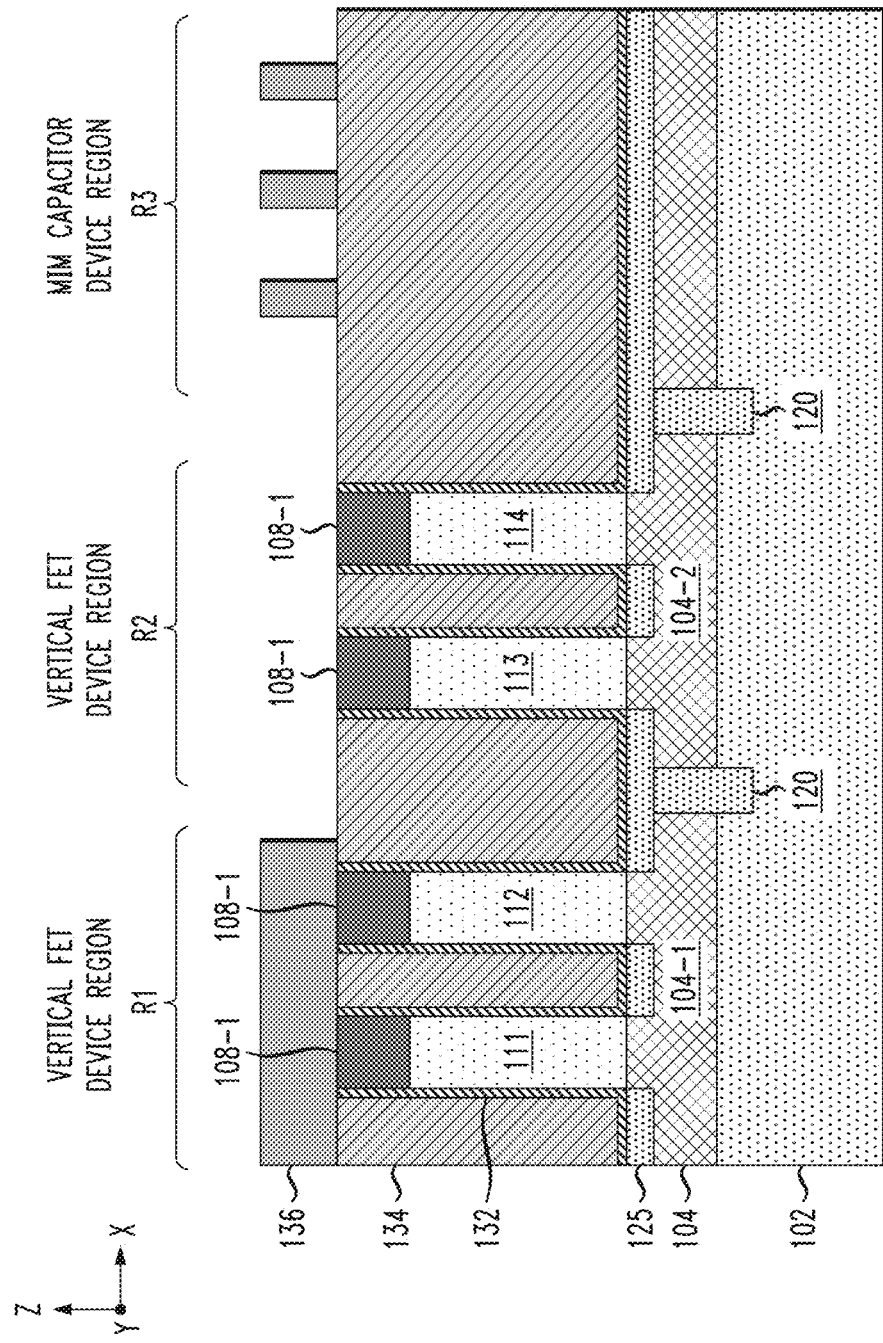

Next, FIG. 8 is a schematic cross-sectional side view of the semiconductor structure of FIG. 7 after planarizing the surface of the semiconductor structure down to the etch hardmask 108-1 and forming a first cut mask 136 over the planarized surface of the semiconductor structure. The first cut mask 136 is formed with an image that defines the gate electrode 134A of the gate structure 130 of the vertical FET device in the first device region R1, and the first capacitor electrode 134B of the MIM capacitor device 150 in the third device region R3. The first layer of conductive material 134 and the first conformal layer of dielectric material 132 are patterned using the image of the first cut mask 136, as schematically illustrated in FIGS. 9A and 9B.

Figure 9B:
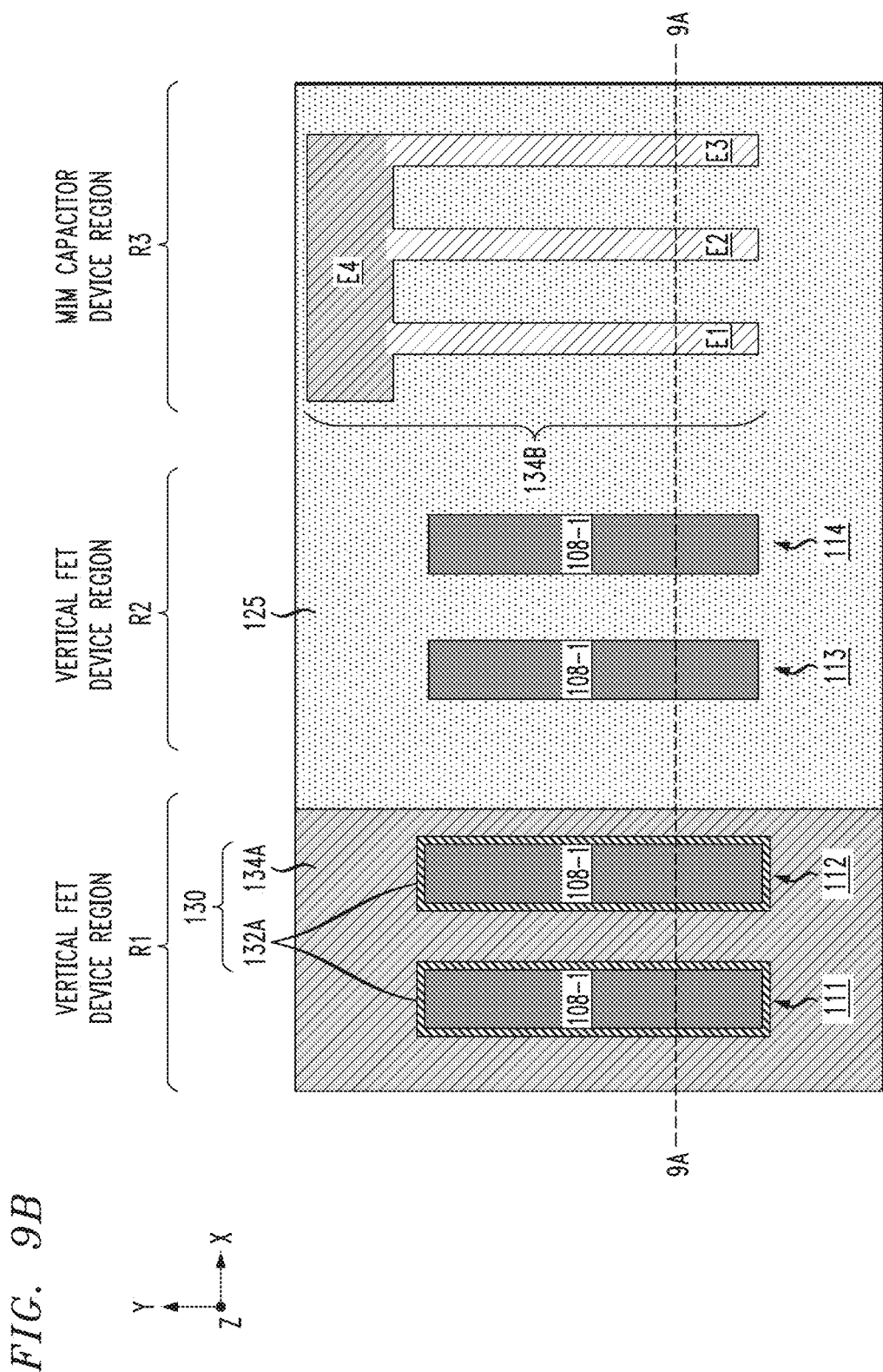

In particular, FIG. 9A is a schematic cross-sectional side view of the semiconductor structure of FIG. 8 after patterning the first layer of conductive material 134 and the first conformal layer of dielectric material 132 using the first cut mask 136 to form the gate structure 130 (comprising the gate dielectric layer 132A and the gate electrode 134A) in the first device region R1, and the first capacitor electrode 134B in the third device region R3. FIG. 9B is a schematic top plan view (X-Y plane) of the semiconductor structure of FIG. 9A, and FIG. 9A is a cross-sectional side view (X-Z plane) of the semiconductor structure taken along line 9A-9A in FIG. 9B. The patterning process is performed by etching away exposed portions of the first layer of conductive material 134 and the first conformal layer of dielectric material 132 in the second and third device regions R2 and R3 down the lower insulating spacer 125.

As shown in FIGS. 9A and 9B, the etch process results in the formation of the gate structure 130 of the vertical FET device in the first region R1, wherein the gate structure 130 comprises the conformal gate dielectric layer 132A disposed on the sidewalls of the vertical semiconductor fins 111 and 112, and the gate electrode 134A disposed around the sidewalls of the vertical semiconductor fins 111 and 112. In addition, the etch process results in the removal of the portions of the first conformal layer of dielectric material 132 and the first layer of conductive material 134 in the second device region R2 to expose the vertical semiconductor fins 113 and 114. Further, the etch process results in the patterning of the first capacitor electrode 134B comprising the various vertical fin segments E1, E2, E3, and E4. As shown in FIG. 9A, following the etch process, portions of the first conformal layer of dielectric material 132 which are covered by the first capacitor electrode 134B remain in the third device region R3.

Figure 10:
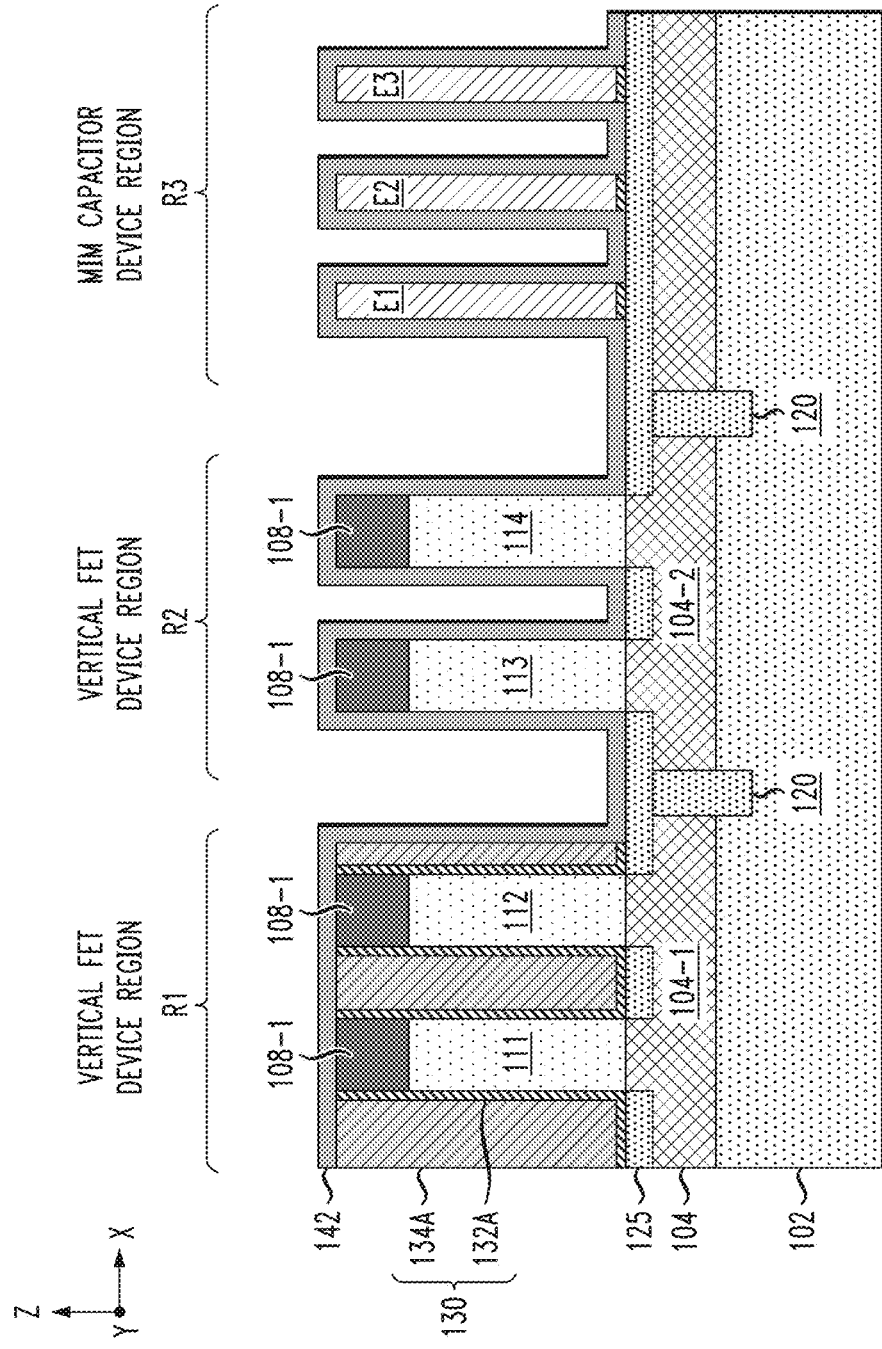

A next phase of the semiconductor fabrication process implements an integrated process module to concurrently form the gate structure 140 (e.g., metal gate structure) of the vertical FET device in the second device region R2 and the capacitor insulator layer 142B and the second capacitor electrode 144B of the MIM capacitor device 150 in the third device region R3, using a process flow as schematically illustrated in FIGS. 10-13. In particular, as an initial step, FIG. 10 is a schematic cross-sectional side view of the semiconductor structure of FIG. 9A after depositing a second conformal layer of dielectric material 142 over the surface of the semiconductor structure. The second conformal layer of dielectric material 142 is subsequently patterned to form the gate dielectric layer 142A of the gate structure 140 of the vertical FET device in the second device region R2, and the capacitor insulator layer 142B of the MIM capacitor device 150 in the third device region R3. In one embodiment, the second conformal layer of dielectric material 142 is formed of silicon oxide or a high-k dielectric material which is suitable for the given application. In one embodiment, the second conformal layer of dielectric material 142 is formed with a thickness in a range of about 5 nm or greater (e.g., about 5 nm to about 20 nm), which is thicker than the first conformal layer of dielectric material 132 that forms the gate dielectric layer 132A of the gate structure 130 of the vertical FET device in the first device region R1.

Figure 11:
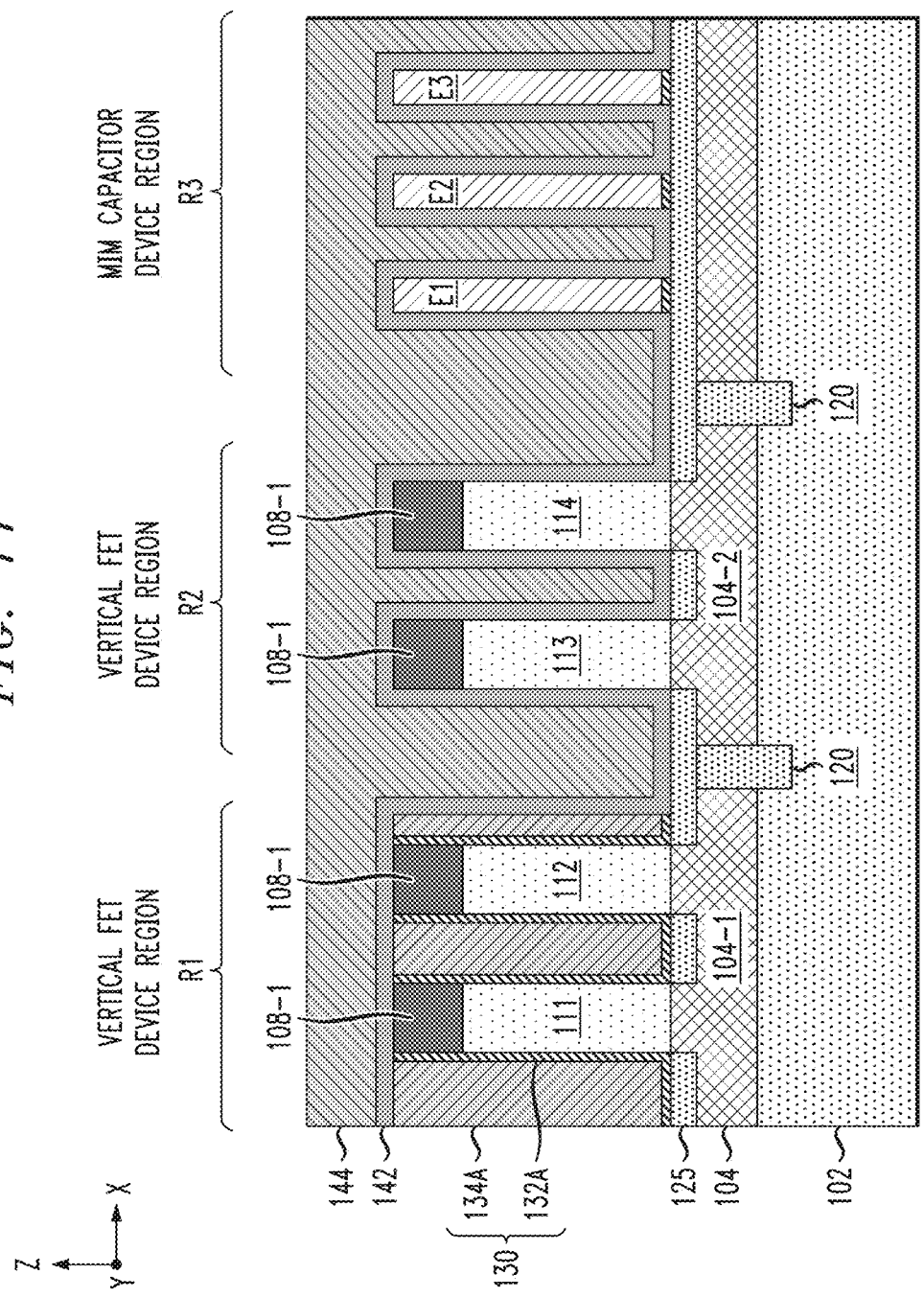

Next, FIG. 11 is a schematic cross-sectional view of the semiconductor structure of FIG. 10 after depositing a second layer of conductive material 144 over the second conformal layer of dielectric material 142. In one embodiment, the second layer of conductive material 144 is formed of the same or similar material(s) as the first layer of conductive material 134 which forms the gate electrode 134A and the first capacitor electrode 134B. For example, the second layer of conductive material 144 may comprise a metallic material such as tungsten, or any other suitable metallic material such as titanium, tantalum, ruthenium, zirconium, cobalt, copper, aluminum, lead, platinum, tin, silver, gold, etc. In other embodiments, the second layer of conductive material 144 may be a conductive material including, but not limited to, a doped semiconductor material, a conducting metallic compound material, etc. The second layer of conductive material 144 may further comprise dopants that are incorporated during or after deposition. The second layer of conductive material 144 is deposited using a suitable deposition process, for example, CVD, PECVD, PVD, plating, thermal or e-beam evaporation, sputtering, etc.

Figure 12:
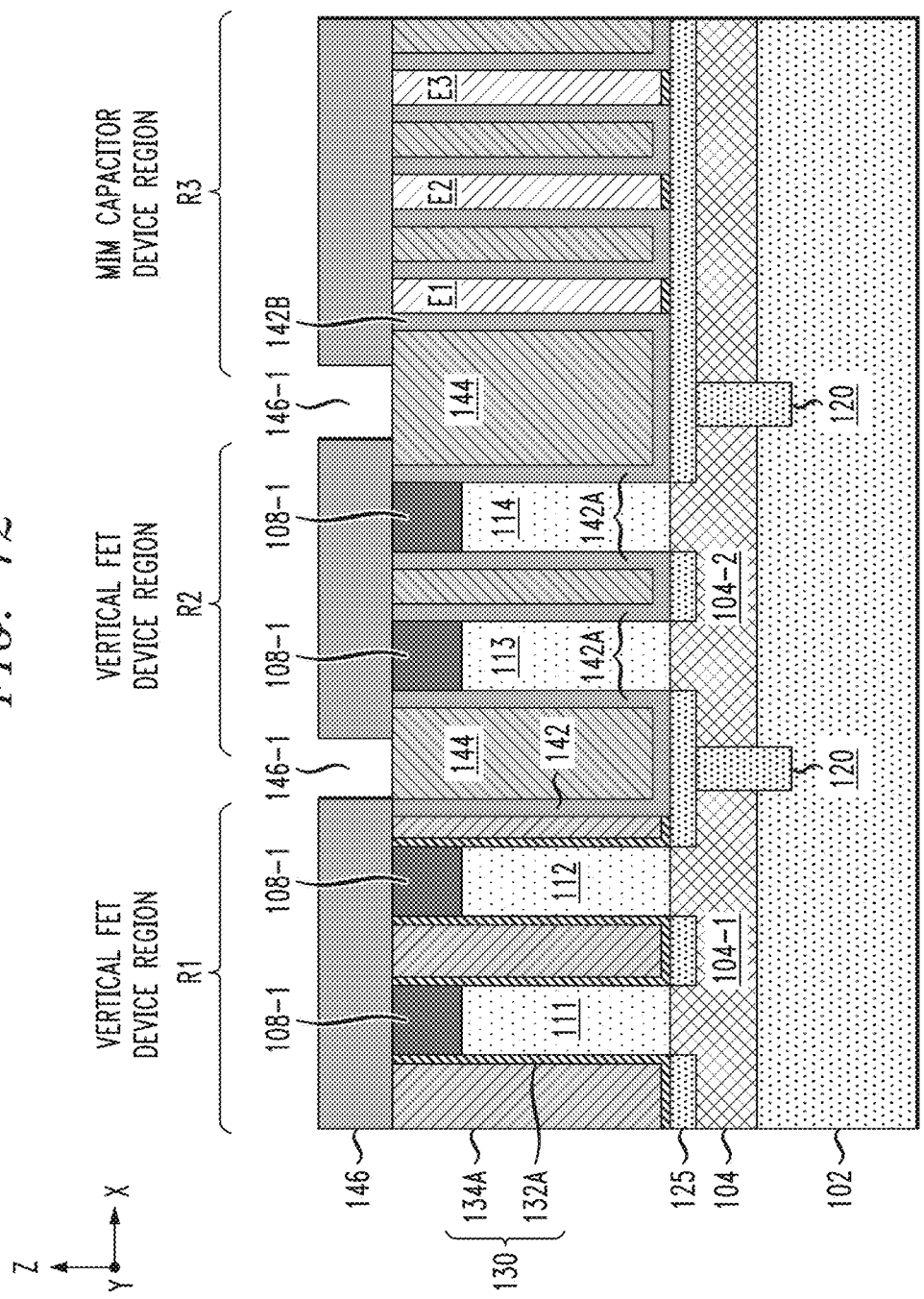

FIG. 12 is a schematic cross-sectional side view of the semiconductor structure of FIG. 11 after planarizing (e.g., CMP) the surface of the semiconductor structure down to the etch hardmask 108-1 to remove overburden portions of the second layer of conductive material 144 and the second conformal layer of dielectric material 142, and forming a second cut mask 146 over the planarized surface of the semiconductor structure. In particular, as shown in FIG. 12, the second cut mask 146 comprises openings 146-1 that are aligned with, or substantially overlap, the trench isolation regions 120. The planarizing process of FIG. 12 results in patterning the second conformal layer of dielectric material 142 to concurrently form the gate dielectric layer 142A of the gate electrode 140 of the vertical FET device in the second device region R2 and the capacitor insulator layer 142B of the MIM capacitor device 150 in the third device region R3.

Figure 13:
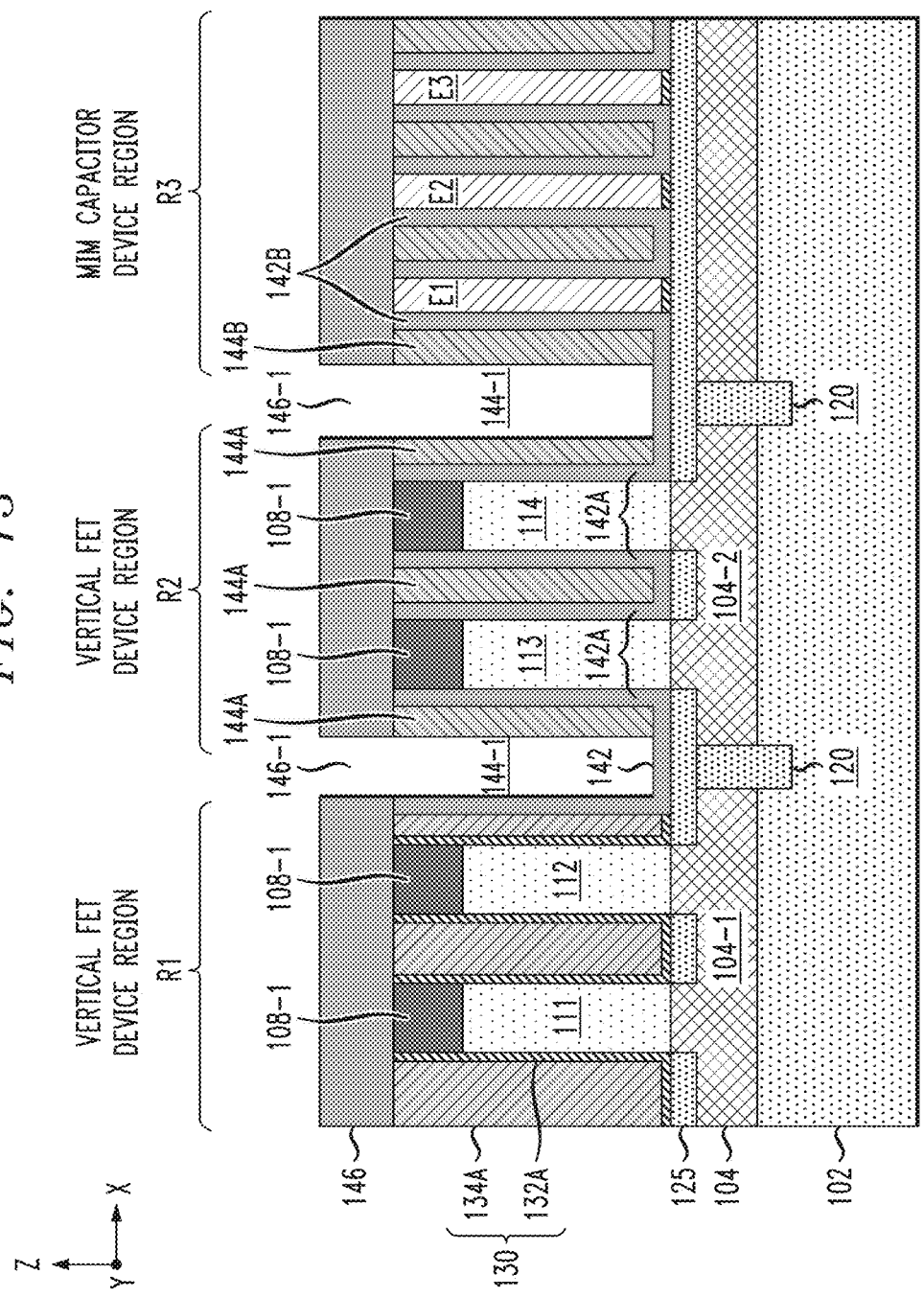

FIG. 13 is a schematic cross-sectional side view of the semiconductor structure of FIG. 12 after patterning the second layer of conductive material 144 using an image of the second cut mask 146 to form trenches 144-1 in the second layer of conductive material 144 which define the gate electrode 144A in the second device region R2 and the second capacitor electrode 144B in the third device region R3. In particular, the portions of the second layer of conductive material 144 that are exposed through the openings 146-1 of the second cut mask 146 are anisotropically etched down (e.g., using RIE) to the second conformal layer of dielectric material 142 to concurrently form the gate electrode 144A and the second capacitor electrode 144B.

Figure 14A:
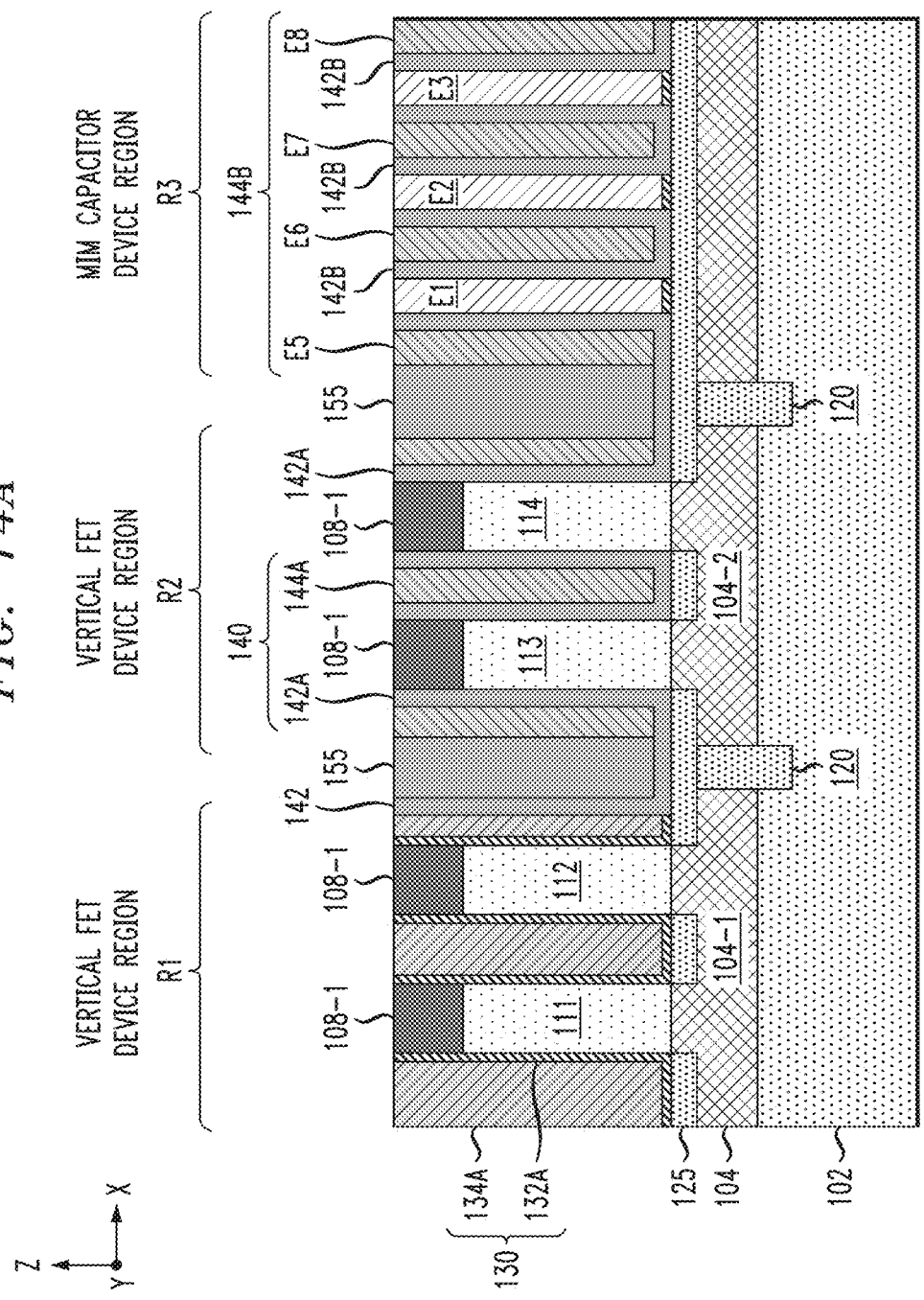
FIGS. 14A and 14B are schematic views of the semiconductor structure of FIG. 13 after filling the trenches with insulating material to form insulating regions which electrically insulate the gate electrodes and the second capacitor electrode.
Figure 14B:
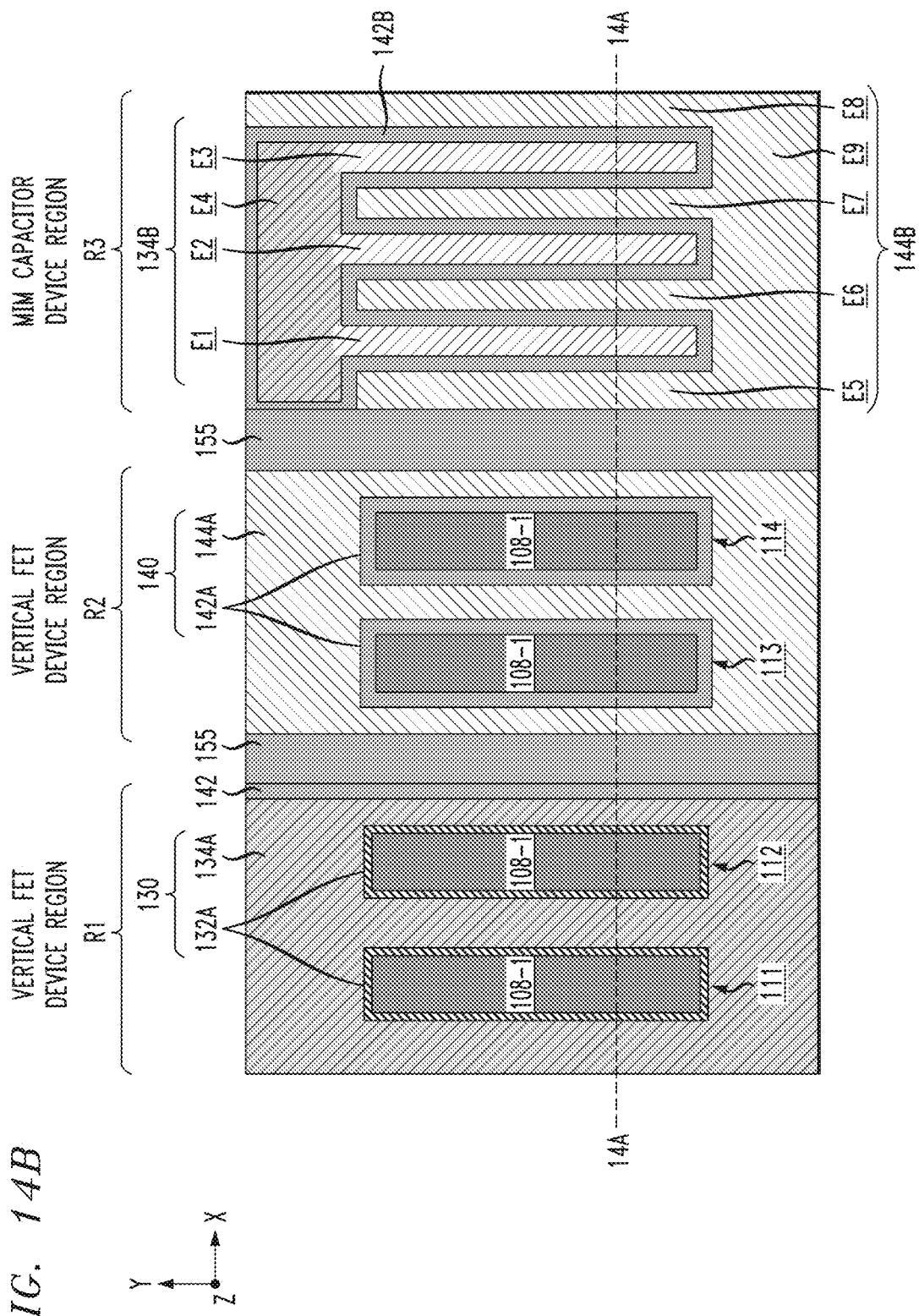

FIGS. 14A and 14B are schematic views of the semiconductor structure of FIG. 13 after filling the trenches 144-1 with insulating material to form the insulating regions 155 which serve to electrically insulate the gate electrodes 134A and 144A, and the second capacitor electrode 144B from surrounding structures. FIG. 14B is a schematic top plan view (X-Y plane) of the semiconductor structure of FIG. 14A, and FIG. 14A is a cross-sectional side view (X-Z plane) of the semiconductor structure taken along line 14A-14A in FIG. 14B. In one embodiment, the insulating regions 155 are formed by blanket depositing a layer of insulation material (e.g., silicon oxide) to fill the trenches 144-1 with insulating material, followed by a CMP process to remove the overburden portion of the insulating material and planarize the surface of the semiconductor structure down to the etch hardmask 108-1, resulting in the semiconductor structure shown in FIGS. 14A and 14B.

As shown in FIGS. 14A and 14B, the patterning of the second layer of conductive material 144 results in the formation of the gate electrode 144A in the second device region R2 and the formation of the second capacitor electrode 144B in the third device region R3, wherein the second capacitor electrode 144B comprises the vertical fin segments E5, E6, E7, E8, and E9. The first and second capacitor electrodes 134B and 144B comprise comb-like electrode structures with parallel vertical fin segments of the first and second capacitor electrodes 134B and 144B disposed in an overlapped, interdigitated configuration. In addition, a remaining portion of the second conformal layer of dielectric material 142 which surrounds the sidewalls of the vertical semiconductor fins 113 and 114 serve as the gate dielectric layer 142A of the gate structure 140 of the vertical FET device in the second device region R2, and a remaining portion of the second conformal layer of dielectric material 142 disposed between the first and second capacitor electrodes 134B and 144B serves as the capacitor insulator layer 142B of the MIM capacitor device 150 in the third device region R3.

Figure 15:
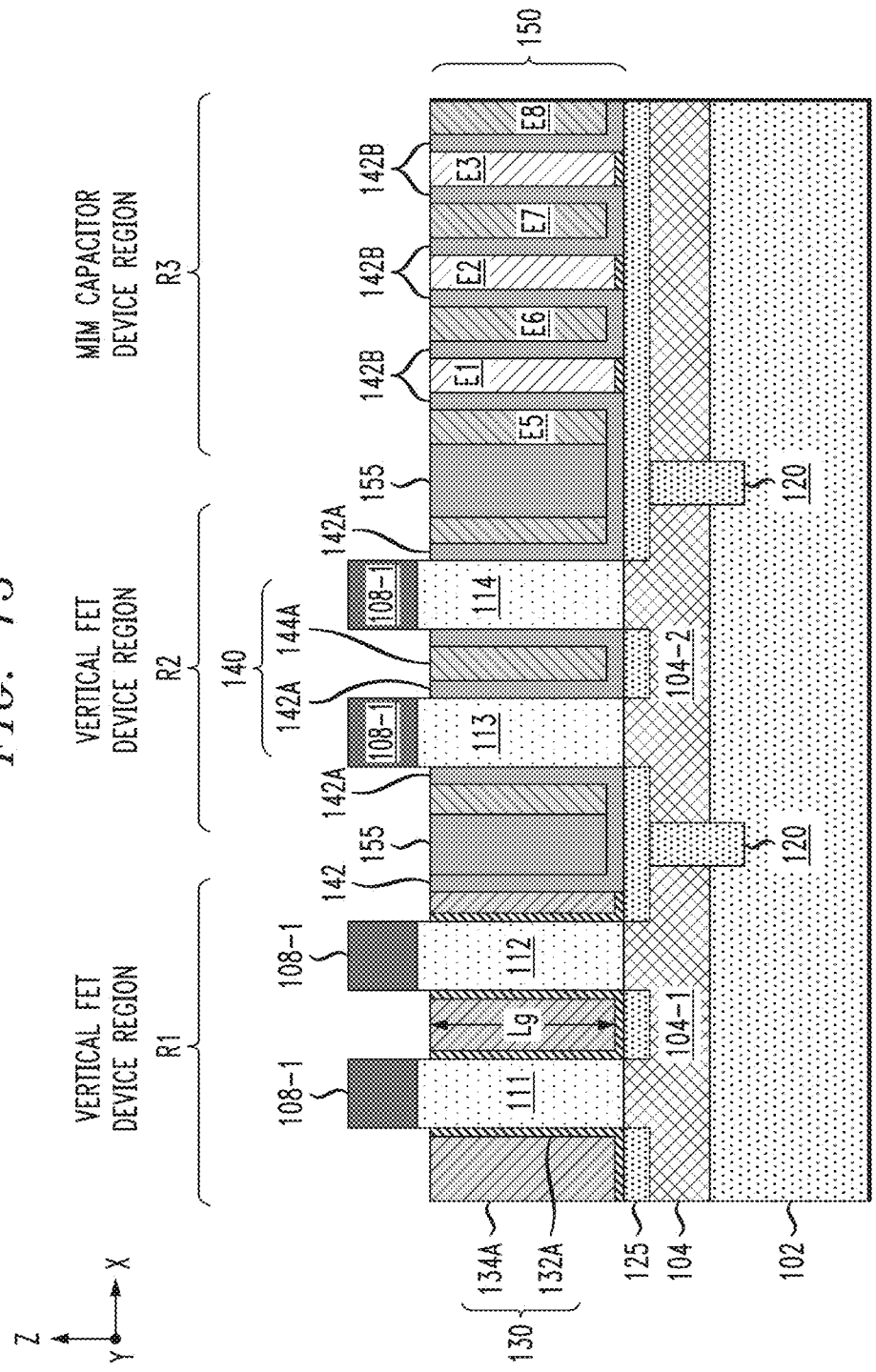

A next phase of the semiconductor fabrication process comprises forming the upper insulating spacer 165 and the upper source/drain regions 162 and 164 of the semiconductor device 100 as shown in FIGS. 1A and 1B, using a process flow as schematically illustrated in FIGS. 15-18. As an initial step, FIG. 15 is a schematic cross-sectional side view of the semiconductor structure of FIG. 14A after recessing upper surfaces of the gate structures 130 and 140, the MIM capacitor device 150, and the insulating regions 155 to a target level that defines a gate length Lg of the vertical FET devices in the first and second device regions R1 and R2. The recess process is performed using, for example, an RIE process having an etch chemistry which is suitable to etch the conductive and insulating materials selective to the etch hardmask 108-1. In one example embodiment as shown in FIG. 15, the upper surfaces of the gate structures 130 and 140 are recessed to a depth that is below an upper surface of the vertical semiconductor fins 111, 112, 113, and 114.

Figure 16:
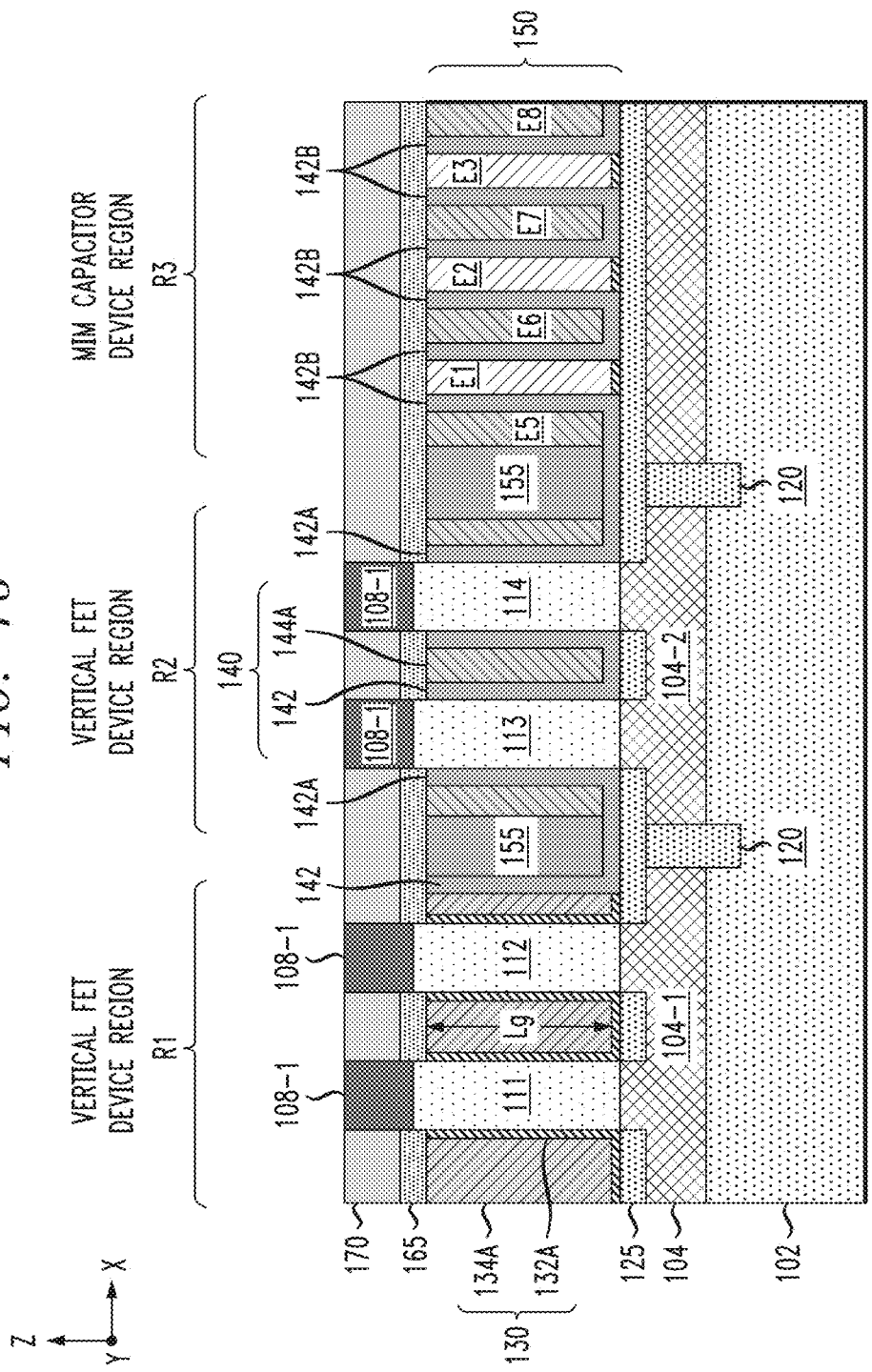

Next, FIG. 16 is a schematic cross-sectional side view of the semiconductor structure of FIG. 15 after forming the upper insulating spacer 165 on the recessed surfaces of the gate electrodes 130 and 140, the insulating regions 155, and the MIM capacitor device 150, and forming the first ILD layer 170 on the upper insulating spacer 165. In one embodiment, the upper insulating spacer 165 is formed by depositing a layer of dielectric material such as $SiO_2$, SiN, SiBCN or SiOCN, or some other type of low-k dielectric material that is commonly used to form insulating spacers for vertical FET devices. In one embodiment, the upper insulating spacer 165 can be formed using a directional deposition process in which the dielectric/insulating material is directly deposited on lateral surfaces. In one embodiment, the first ILD layer 170 is formed of an insulating material, such as a silicon oxide, which has etch selectivity with respect to the material forming the etch hardmask 108-1. The first ILD layer 170 can be formed by blanket depositing a layer of insulating material (e.g., silicon oxide) over the surface of the semiconductor structure, and then planarizing the surface of the semiconductor structure down to the upper surface of the etch hardmask 108-1, resulting in the intermediate structure shown in FIG. 16.

Figure 17:
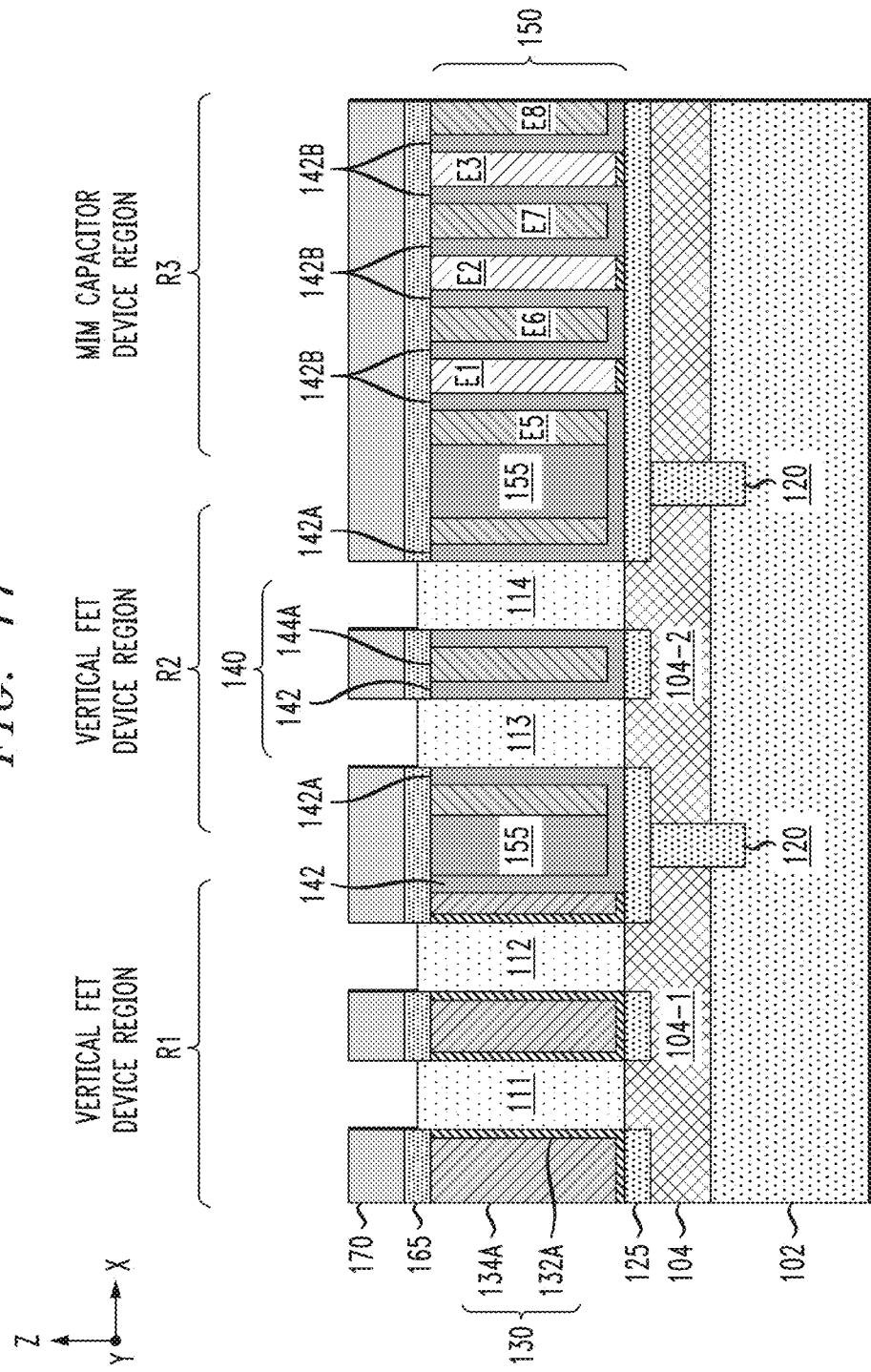

Next, FIG. 17 is a schematic cross-sectional side view of the semiconductor structure of FIG. 16 after removing the etch hardmask 108-1 to expose upper surfaces of the vertical semiconductor fins 111, 112, 113, and 114 on which the upper source/drain regions are epitaxially grown in the first and second device regions R1 and R2. The etch hardmask 108-1 can be removed using any suitable dry or wet etch process with an etch chemistry that is configured to etch the material of the hardmask 108-1 selective to the materials of the first ILD layer 170 and the vertical semiconductor fins 111, 112, 113, and 114. Following removal of the etch hardmask 108-1, the upper source/drain regions 162 and 164 are epitaxially grown on the exposed upper portions of the vertical semiconductor fins 111, 112, 113, and 114 in the first and second device regions R1 and R2, resulting in the intermediate semiconductor structure schematically illustrated in FIG. 18.

In one embodiment, the upper source/drain regions 162 and 164 are formed by epitaxially growing doped semiconductor layers (e.g., doped SiGe) on the exposed upper portions of the vertical semiconductor fins 111, 112, 113, and 114 using known selective growth techniques in which the epitaxial material is not grown on the exposed surface of the first ILD layer 170. The type of epitaxial semiconductor material that is used to form the upper source/drain regions 162 and 164 will vary depending on various factors including, but are not limited to, the type of material of the vertical semiconductor fins 111, 112, 113, and 114, the device type (e.g., n-type or p-type) of the vertical FET devices to be formed in the device regions R1 and R2, etc.

In some embodiments, the source/drain regions 162 and 164 may be in-situ doped during epitaxial growth by adding a dopant gas to the source deposition gas (i.e., the Si-containing gas). Exemplary dopant gases may include a boron-containing gas such as $BH_3$ for pFETs or a phosphorus or arsenic containing gas such as $PH_3$ or $AsH_3$ for nFETs, wherein the concentration of impurity in the gas phase determines its concentration in the deposited film. In an alternate embodiment, the upper source/drain regions 162 and 164 can be doped ex-situ using, for example, ion implantation, gas phase doping, plasma doping, plasma immersion ion implantation, cluster doping, infusion doping, liquid phase doping, solid phase doping, etc. In one non-limiting embodiment, the doping concentration can range from about $1\times10^{19}/cm^3$ to about $4\times10^{21}/cm^3$.

Figure 18:
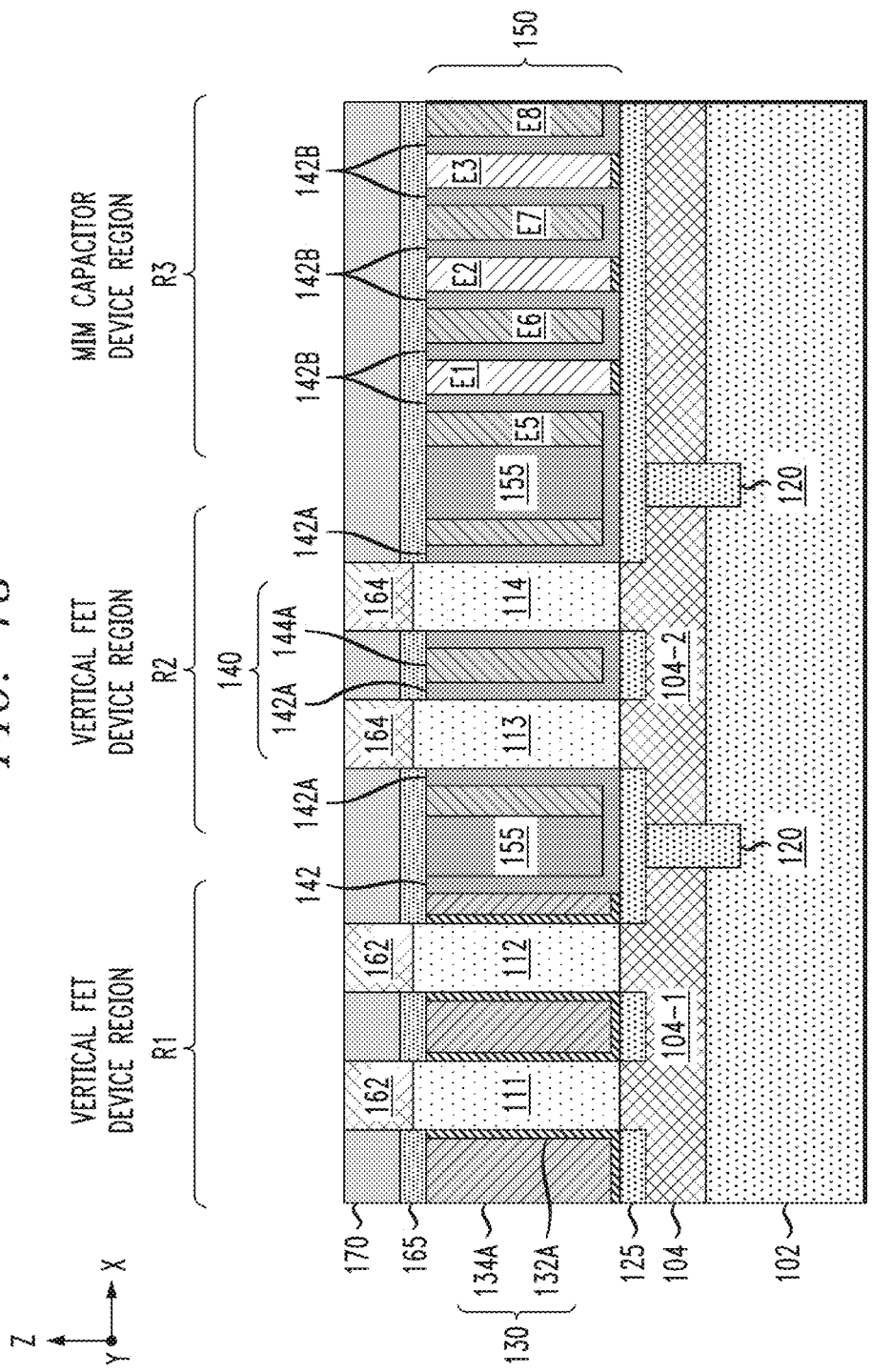

Following the formation of the semiconductor structure shown in FIG. 18, any known sequence of processing steps can be implemented to fabricate the semiconductor integrated circuit device as shown in FIGS. 1A and 1B, the details of which are not needed to understand embodiments of the invention. Briefly, by way of example, referring back to FIG. 1A, after forming the upper source/drain regions 162 and 164, a FEOL process and MOL (middle of the line) process are continued to (i) form the second ILD layer 180, (ii) pattern the second ILD layer 180 to form trenches and/or via openings to expose the upper source/drain regions 162 and 164, and to (iii) fill the trenches and/or via openings with conductive material to form the vertical source/drain contacts 182 and 184.

In addition, vertical contacts (not shown) to the lower source/drain regions 104-1 and 104-2 and the gate structures 130 and 140 in the device regions R1 and R2, and the vertical contacts 186A and 186B (FIG. 1B) to the respective first and second capacitor electrodes 134B and 144B in the third device region R3 can be formed either concurrently, or separately, with the formation of the vertical source/drain contacts 182 and 184 using the same or similar fabrication methods. Following formation of the vertical device contacts, a BEOL (back end of line) interconnect structure is formed to provide connections to/between the vertical FET devices, the MIM capacitor(s), and other active or passive devices that are formed as part of the FEOL layer in the different device regions.

It is to be understood that the methods discussed herein for integrating MIM capacitor formation as part of a FEOL process flow for fabricating vertical FET devices can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method for fabricating a semiconductor device, comprising:
   forming a first vertical field effect transistor (FET) device in a first device region of a substrate, wherein the first vertical FET device comprises a first vertical semiconductor fin, a first lower source/drain region and a first upper source/drain region coupled to a bottom end and a top end, respectively, of the first vertical semiconductor fin, and a first gate structure disposed around sidewalls of the first vertical semiconductor fin, wherein the first gate structure comprises a first gate dielectric layer and a first gate electrode;
   forming a second vertical FET device in a second device region of the substrate, wherein the second vertical FET device comprises a second vertical semiconductor fin, a second lower source/drain region and a second upper source/drain region coupled to a bottom end and a top end, respectively, of the second vertical semiconductor fin, and a second gate structure disposed around sidewalls of the second vertical semiconductor fin, wherein the second gate structure comprises a second gate dielectric layer and a second gate electrode, wherein the second gate dielectric layer has a dielectric material composition which is different from a dielectric material composition of the first gate dielectric layer; and
   forming a capacitor device in a third device region of the substrate, wherein the capacitor device comprises a first capacitor electrode, a second capacitor electrode, and a capacitor insulator layer disposed between the first and second capacitor electrodes;
   wherein the first gate electrode of the first vertical FET device and the first capacitor electrode of the capacitor device are concurrently patterned from and comprise a same first layer of conductive material;
   wherein the second gate electrode of the second vertical FET device and the second capacitor electrode of the capacitor device are concurrently patterned from and comprise a same second layer of conductive material; and
   wherein the second gate dielectric layer of the second vertical FET device and the capacitor insulator layer of the capacitor device are concurrently patterned from and comprise a same layer of dielectric material.

2. The method of claim 1, wherein the first gate dielectric layer comprises one or more conformal layers of high-k gate dielectric material, wherein k greater than 3.9, and wherein the second gate dielectric layer and the capacitor insulator layer of the capacitor device comprise silicon oxide.

3. The method of claim 1, wherein a thickness of the first gate dielectric layer is less than a thickness of said same layer of dielectric material.

4. The method of claim 3, wherein the thickness of the first gate dielectric layer is less than 5 nanometers, and wherein the thickness of said same layer of dielectric material is 5 nanometers or more.

5. The method of claim 1, wherein the first gate structure further comprises a conformal layer of work function metal formed over the first gate dielectric layer, and wherein the first gate electrode is formed over the conformal layer of work function metal.

6. The method of claim 1, wherein forming the first vertical FET device in the first device region of the substrate and forming the second vertical FET device in the second device region of the substrate comprises:
   forming the substrate comprising a lower source/drain layer disposed between a base semiconductor substrate and a layer of semiconductor material;
   patterning the layer of semiconductor material to form the first vertical semiconductor fin and the second vertical semiconductor fin;
   forming trench isolation regions through portions of the lower source/drain layer and into the semiconductor substrate to define a plurality of device regions comprising the first device region, the second device region, and the third device region, and to define the first and second lower source drain regions, wherein the first device region comprises the first vertical semiconductor fin and the first lower source/drain region coupled to the bottom end of the first vertical semiconductor fin, and wherein the second device region comprises the second vertical semiconductor fin and the second lower source/drain region coupled to the bottom end of the second vertical semiconductor fin.

7. The method of claim 6, further comprising:
   forming a lower insulating spacer on the first and second lower source/drain regions, wherein the lower insulating spacer electrically insulates the first and second lower source/drain regions from the first and second gate structures;
   forming an upper insulating spacer on upper surfaces of the first and second gate structures, and on an upper surface of the capacitor device in the third device region; and
   forming the first upper source/drain region on the top end of the first vertical semiconductor fin, and the second upper source/drain region on the top end of the second vertical semiconductor fin, wherein the upper insulating spacer electrically insulates the first and second upper source/drain regions from the first and second gate structures.

8. The method of claim 6, wherein the layer of semiconductor material comprises a layer of monocrystalline semiconductor material.

9. The method of claim 1, wherein the first capacitor electrode and the second capacitor electrode each comprise a plurality of parallel vertical conductive fins that are disposed in an overlapped, interdigitated configuration, with the capacitor insulator layer disposed between the first and second capacitor electrodes.

10. A method for fabricating a semiconductor device, comprising:
- forming a substrate comprising a lower source/drain layer disposed between a base semiconductor substrate and a layer of semiconductor material;
- patterning the layer of semiconductor material to form at least a first vertical semiconductor fin and a second vertical semiconductor fin;
- forming trench isolation regions through portions of the lower source/drain layer and into the semiconductor substrate to define a plurality of device regions comprising a first device region, a second device region, and a third device region, wherein the first device region comprises the first vertical semiconductor fin and a first lower source/drain region coupled to a bottom end of the first vertical semiconductor fin, and wherein the second device region comprises the second vertical semiconductor fin and a second lower source/drain region coupled to a bottom end of the second vertical semiconductor fin;
- concurrently forming (i) a first gate structure surrounding sidewalls of the first vertical semiconductor fin in the first device region, and (ii) a first capacitor electrode in the third device region, wherein the first gate structure comprises a first gate dielectric layer and a first gate electrode;
- wherein the first gate electrode and the first capacitor electrode are concurrently patterned from and comprise a same first layer of conductive material; and
- concurrently forming (i) a second gate structure surrounding sidewalls of the second vertical semiconductor fin in the second device region, (ii) a capacitor insulator layer on the first capacitor electrode and (iii) a second capacitor electrode on the capacitor insulator layer in the third device region, wherein the second gate structure comprises a second gate dielectric layer and a second gate electrode;
- wherein the second gate dielectric layer and the capacitor insulator layer are concurrently patterned from and comprises a same conformal layer of dielectric material;
- wherein the second gate electrode and the second capacitor electrode are concurrently patterned from and comprise a same second layer of conductive material; and
- wherein the second gate dielectric layer has a dielectric material composition which is different from a dielectric material composition of the first gate dielectric layer.

11. The method of claim 10, further comprising:
- forming a lower insulating spacer on the first and second lower source/drain regions, wherein the lower insulating spacer electrically insulates the first and second lower source/drain regions from the first and second gate structures;
- forming an upper insulating spacer on upper surfaces of the first and second gate structures, and on an upper surface of a capacitor structure formed by the first and second capacitor electrodes and the capacitor insulator layer in the third device region; and
- forming a first upper source/drain region on a top end of the first vertical semiconductor fin, and a second upper source/drain region on a top end of the second vertical semiconductor fin.

12. The method of claim 10, wherein the layer of semiconductor material comprises a layer of monocrystalline semiconductor material.

13. The method of claim 10, wherein concurrently forming the first gate structure in the first device region and the first capacitor electrode in the third device region, comprises:
- depositing a first conformal layer of dielectric material within the first, second and third device regions;
- depositing a conformal work function metal layer over the first conformal layer of dielectric material;
- depositing the first layer of conductive material over the conformal work function metal layer within the first, second, and third device regions;
- planarizing a surface of the semiconductor device to remove overburden portions of the first layer of conductive material, the conformal work function metal layer, and the first conformal layer of dielectric material disposed over top ends of the first and second vertical semiconductor fins in the first and second device regions;
- forming a first cut mask on the planarized surface of the semiconductor device, wherein the first cut mask comprises an image of the first gate structure and the first capacitor electrode; and
- etching portions of the first layer of conductive material, the conformal work function metal layer, and the first conformal layer of dielectric material, which are exposed through the first cut mask, to concurrently form the first gate structure and the first capacitor electrode in the first and third device regions, while removing portions of the first conformal layer of gate dielectric material, the conformal work function metal layer, and the first layer of conductive material within the second device region,
- wherein a remaining portion of the first conformal layer of dielectric material in the first device region forms the first gate dielectric layer of the first gate structure.

14. The method of claim 13, wherein depositing the first conformal layer of dielectric material comprises depositing one or more conformal layers of high-k dielectric material, wherein k is about 3.9 or greater.

15. The method of claim 13, wherein concurrently forming the second gate structure, the capacitor insulator layer, and the second capacitor electrode, comprises:
- depositing said same conformal layer of dielectric material within the first, second and third device regions;
- depositing the second layer of conductive material over said same conformal layer of dielectric material within the first, second, and third device regions;
- planarizing a surface of the semiconductor device to remove overburden portions of the second layer of conductive material and said same conformal layer of dielectric material disposed over the top ends of the first and second vertical semiconductor fins in the first and second device regions, and an upper surface of the first capacitor electrode in the third device region;
- forming a second cut mask on the planarized surface of the semiconductor device, wherein the second cut mask comprises openings that are aligned with, or at least overlap portions of, respective trench regions of the plurality of trench regions;
- etching trenches in portions of the second layer of conductive material, which are exposed through the openings of the second cut mask, to concurrently form the second gate structure in the second device region, and the second capacitor electrode in the third device region; and
- filling the trenches with insulating material.

16. The method of claim 15, wherein a thickness of the first conformal layer of dielectric material is less than a thickness of said same conformal layer of dielectric material.

17. The method of claim 10, wherein the first capacitor electrode and the second capacitor electrode each comprise a plurality of parallel vertical conductive fins that are disposed in an overlapped, interdigitated configuration, with the capacitor insulator layer disposed between the first and second capacitor electrodes.

* * * * *